(12) United States Patent
Zhang et al.

(10) Patent No.: US 8,253,118 B2
(45) Date of Patent: Aug. 28, 2012

(54) CHARGED PARTICLE BEAM SYSTEM HAVING MULTIPLE USER-SELECTABLE OPERATING MODES

(75) Inventors: Shouyin Zhang, Portland, OR (US); Tom Miller, Portland, OR (US); Sean Kellogg, Portland, OR (US); Anthony Graupera, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 246 days.

(21) Appl. No.: 12/579,237

(22) Filed: Oct. 14, 2009

(65) Prior Publication Data

US 2011/0084207 A1  Apr. 14, 2011

(51) Int. Cl.
*H01J 49/10* (2006.01)
*H01J 27/02* (2006.01)

(52) U.S. Cl. ............... 250/492.21; 250/397; 250/398

(58) Field of Classification Search ......... 250/492.21, 250/397, 398
See application file for complete search history.

(56) References Cited

U.S. PATENT DOCUMENTS

| | | | |
|---|---|---|---|
| 3,313,969 A * | 4/1967 | Wolter .................. | 313/360.1 |
| 4,556,794 A | 12/1985 | Ward et al. | |
| 4,743,767 A * | 5/1988 | Plumb et al. ............ | 250/492.2 |
| 4,754,200 A * | 6/1988 | Plumb et al. ............ | 315/111.81 |
| 4,929,839 A | 5/1990 | Parker et al. | |
| 5,497,006 A * | 3/1996 | Sferlazzo et al. ........ | 250/427 |
| 6,797,964 B2 * | 9/2004 | Yamashita ............... | 250/423 R |
| 7,022,999 B2 * | 4/2006 | Horsky et al. .......... | 250/427 |
| 7,064,491 B2 * | 6/2006 | Horsky et al. .......... | 315/111.81 |
| 7,241,361 B2 | 7/2007 | Keller et al. | |
| 7,365,346 B2 * | 4/2008 | Sasaki et al. ............ | 250/492.21 |
| 7,381,944 B2 * | 6/2008 | Cameron et al. ........ | 250/282 |
| 7,399,958 B2 * | 7/2008 | Miller et al. ............ | 250/286 |
| 7,436,177 B2 * | 10/2008 | Gorrell et al. .......... | 324/317 |
| 7,670,455 B2 | 3/2010 | Keller et al. | |
| 7,714,284 B2 * | 5/2010 | Miller et al. ............ | 250/295 |
| 7,732,787 B2 * | 6/2010 | Horsky .................. | 250/423 R |
| 7,800,312 B2 * | 9/2010 | Horsky .................. | 315/111.81 |
| 7,834,554 B2 * | 11/2010 | Horsky .................. | 315/111.81 |
| 7,838,842 B2 * | 11/2010 | Horsky .................. | 250/423 R |
| 7,838,850 B2 * | 11/2010 | Hahto et al. ............ | 250/492.21 |
| 7,863,581 B2 * | 1/2011 | Lozano et al. .......... | 250/423 R |
| 2005/0173629 A1 * | 8/2005 | Miller et al. ............ | 250/290 |
| 2008/0164427 A1 * | 7/2008 | Collart et al. .......... | 250/492.21 |

(Continued)

FOREIGN PATENT DOCUMENTS

EP        0179294        4/1986

*Primary Examiner* — David A Vanore
(74) *Attorney, Agent, or Firm* — Scheinberg & Associates, PC; Michael O. Scheinberg

(57) ABSTRACT

A method for performing milling and imaging in a focused ion beam (FIB) system employing an inductively-coupled plasma ion source, wherein two sets of FIB system operating parameters are utilized: a first set representing optimized parameters for operating the FIB system in a milling mode, and a second set representing optimized parameters for operating in an imaging mode. These operating parameters may comprise the gas pressure in the ICP source, the RF power to the ICP source, the ion extraction voltage, and in some embodiments, various parameters within the FIB system ion column, including lens voltages and the beam-defining aperture diameter. An optimized milling process provides a maximum milling rate for bulk (low spatial resolution) rapid material removal from the surface of a substrate. An optimized imaging process provides minimized material removal and higher spatial resolutions for improved imaging of the substrate area being milled.

22 Claims, 10 Drawing Sheets

U.S. PATENT DOCUMENTS

| | | |
|---|---|---|
| 2008/0314871 A1 | 12/2008 | Toth et al. |
| 2009/0173894 A1* | 7/2009 | Alcott et al. ............. 250/492.21 |
| 2009/0230299 A1* | 9/2009 | Shichi et al. .................. 250/282 |
| 2009/0309018 A1 | 12/2009 | Smith et al. |
| 2010/0044580 A1 | 2/2010 | Boswell et al. |
| 2010/0126964 A1 | 5/2010 | Smith et al. |
| 2010/0243889 A1 | 9/2010 | Faber et al. |
| 2010/0301211 A1 | 12/2010 | Miller |
| 2011/0049382 A1 | 3/2011 | Miller et al. |
| 2011/0163068 A1 | 7/2011 | Utlaut et al. |

\* cited by examiner

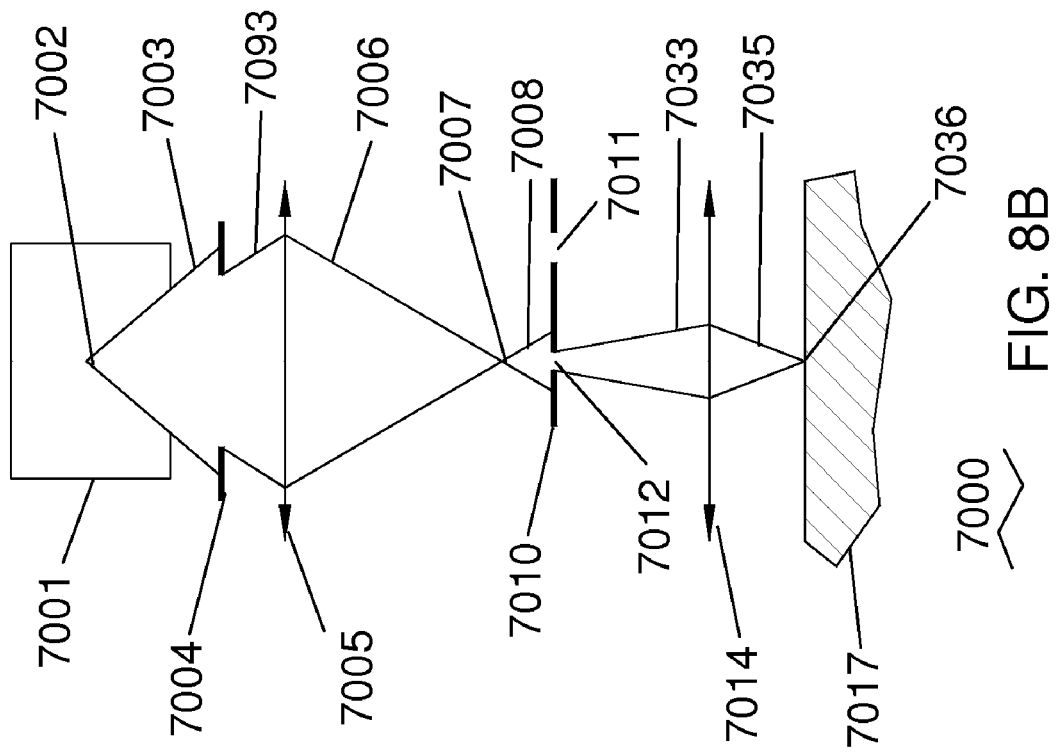
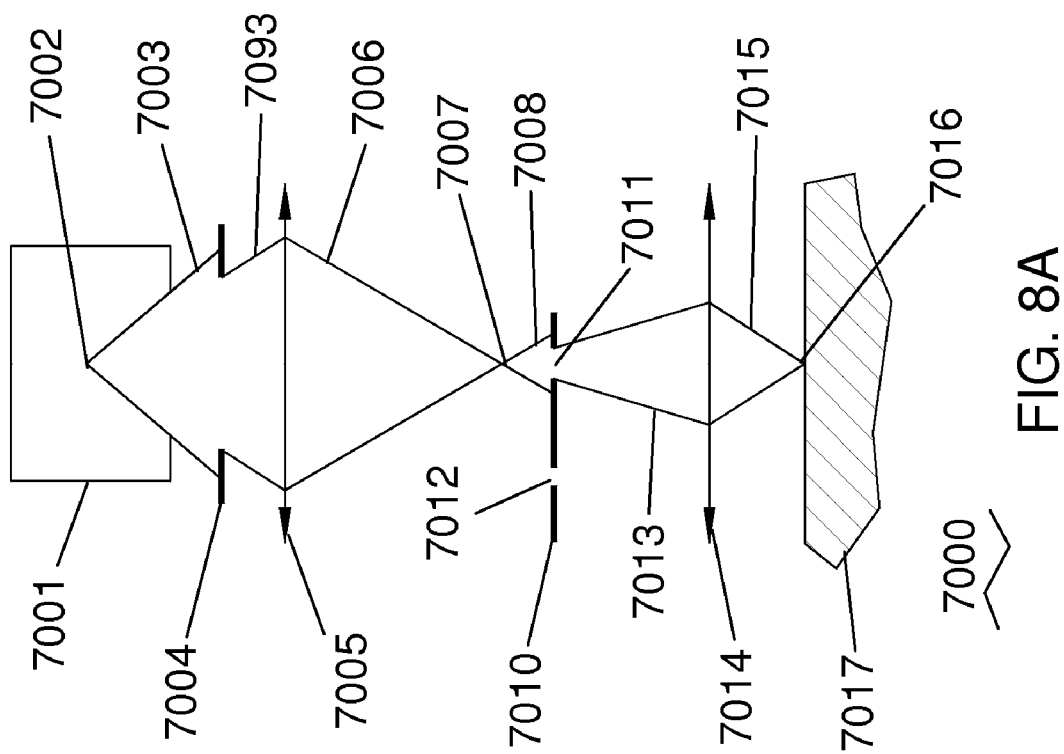
FIG. 8A
FIG. 8B

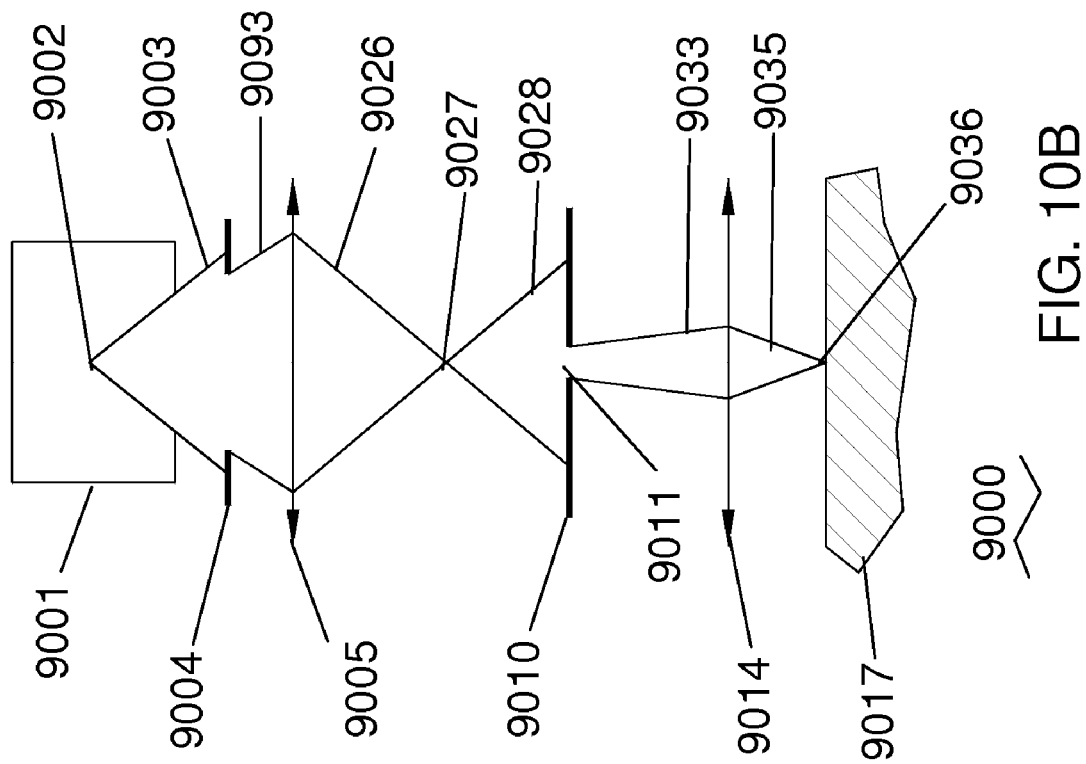
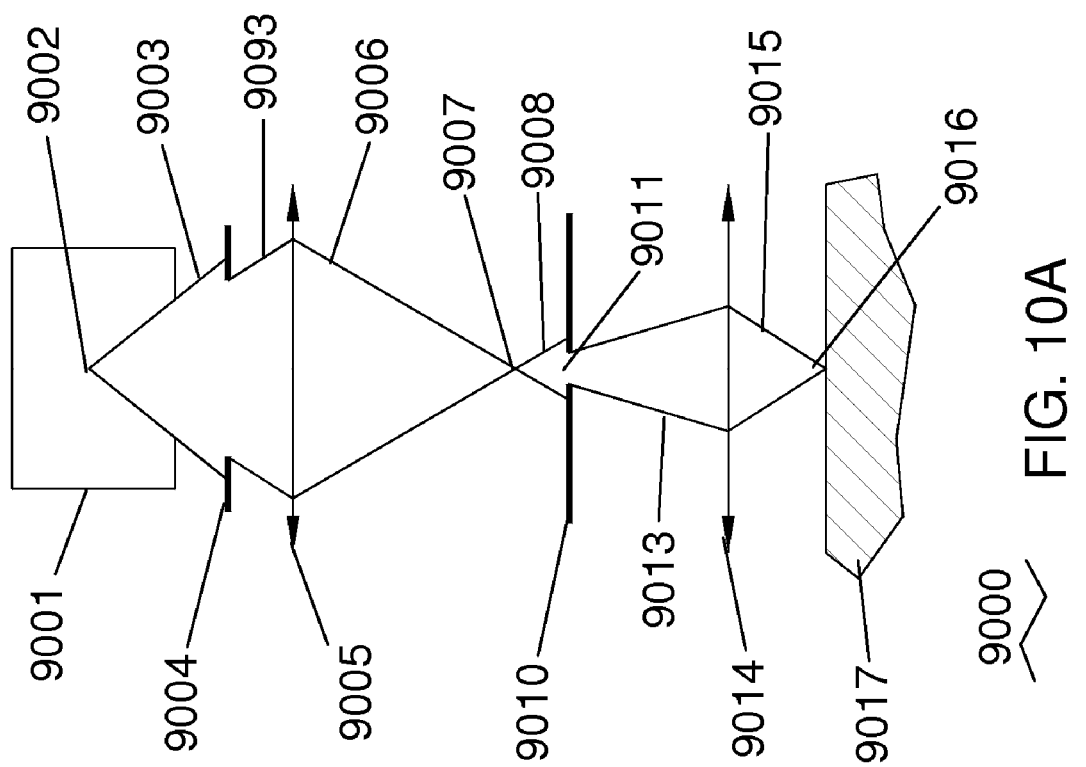
FIG. 10A
FIG. 10B

CHARGED PARTICLE BEAM SYSTEM HAVING MULTIPLE USER-SELECTABLE OPERATING MODES

TECHNICAL FIELD OF THE INVENTION

The present invention relates to charged particle beam systems capable of operating in multiple user-selectable modes.

BACKGROUND OF THE INVENTION

Many areas of nanotechnology utilize focused charged particle beams as precision tools, for altering a work piece by scanning the charged particle beam over a work piece in a pattern to remove material, with or without an etch precursor gas, or to add material through deposition of the charged particle beam or by beam-induced decomposition of a deposition precursor gas. The progress of the milling or deposition process during the formation of patterns is often monitored by an imaging process. Typically, during milling and deposition, the focused charged particle beam is vectored across the surface of the substrate in a predetermined pattern. This vectoring process is accomplished by beam deflectors which generate electrostatic or magnetic dipole fields directed perpendicularly to the direction of beam travel. Usually, means are also provided for turning the beam on and off, a process called "beam blanking". The milling process utilizes the high atomic weight and high energy of the charged particles in the beam to sputter away atoms from the substrate, thereby "milling" a pattern into the substrate surface, wherein the milled pattern corresponds to the trajectory of the charged particle beam across the substrate surface. The deposition process may utilize lower energy beams of atomic or molecular ions comprising a material to be deposited on the substrate surface, wherein the deposited pattern corresponds to the trajectory of the ion beam across the substrate surface. In other embodiments, the deposition process may utilize electron beams which induce the decomposition on the surface of a deposition precursor gas. In many cases, it is not possible to precisely calculate the rate of material removal or deposition due to the charged particle beam, thus some means of monitoring the etching or deposition progress is desirable. This monitoring process is called "imaging", wherein the surface is typically scanned with a beam in an X-Y raster or serpentine pattern to generate some form of imaging signal which is then used to modulate the intensity of a display screen to provide an image of the surface where the milling or deposition process has occurred. There are a number of methods in the prior art which have been employed for the imaging process, as described below.

One method for combining milling and imaging processes within a single system is a focused ion beam (FIB) system employing an alloy ion source and an in-column mass spectrometer. An example of such a system is described in U.S. Pat. No. 4,929,839, issued May 29, 1990, "Focused Ion Beam Column". A liquid metal ion source is employed, wherein the liquid metal is an alloy containing two or more atomic species. One example is a silicon-gold eutectic alloy, wherein the eutectic melting temperature is very low compared with the melting temperatures of either silicon or gold (a "deep" eutectic). The beam produced by the ion source contains both silicon and gold ionic species, often with both one and two positive charges per ion. In this FIB column, an ExB ("Wien filter") is located between the first and second electrostatic lenses. By proper adjustment of the crossed electric and magnetic fields in the ExB filter, it is possible to select a single ion species from the ion beam entering the filter to pass through the ExB filter undeflected, wherein all other ion species are deflected off-axis, striking an aperture, and thus being eliminated from the beam that is focused onto the substrate surface. For milling, either single- or doubly-ionized gold ions can be selected for the beam at the substrate. The large atomic weight of the gold ions generally produces very high milling rates. For imaging, different electric and/or magnetic field strengths are set in the ExB filter, causing singly- or doubly-ionized silicon ions to be selected for the beam at the substrate. The low atomic weight of the silicon ions produces relatively low sputtering rates, thereby enabling imaging of the substrate with little damage. This approach to combining milling and imaging within a single tool has the advantage of rapid switching between milling and imaging since changes to the ExB filter electric and/or magnetic field strengths may be made rapidly. Disadvantages include the need for expensive and short-lived alloy liquid metal sources, and the cost and added complexity of the ExB filter in the column.

Another approach for incorporating both milling and imaging in a single tool is exemplified by the FEI Company Expida 1255S dual-beam system. In this tool, two separate columns are employed: a high-resolution electron beam column for imaging, and an ion beam column for milling. An obvious advantage of this approach is that since separate columns are used for the two functions, it is possible to separately optimize the columns for their individual roles: the ion column is used only for milling (not imaging), while the electron column is only for imaging (not milling). A disadvantage of this approach is the added cost and complexity of two columns, and the need to precisely move the substrate from under one column to under the other column. Any relative positioning errors between the two columns may result in positioning errors of the milling beam relative to the desired location of the pattern to be milled.

Another approach to combining milling and imaging in a single system is to simply use a single column, with a source containing a liquid metal such as Gallium. In this case, the source and column operating parameters for the two modes may be identical. The difference between the milling mode and the imaging mode is solely determined by the way the beam is moved across the substrate surface. For example, during milling, the beam might be vectored across the substrate surface to a number of locations in sequence, and allowed to dwell at each location for a time sufficient to induce appreciable material removal by sputtering from the substrate. During imaging, the beam would be rastered across the substrate surface with dwell times at each pixel much shorter than for the milling operation, thereby minimizing substrate milling during imaging. For this approach, the liquid metal ion source (LMIS) runs at a fixed source performance (angular intensity and brightness) by maintaining a constant operating temperature and a fixed extraction voltage and heater filament current. In some cases, different beam-defining apertures may be employed for the milling and imaging modes, enabling high spatial resolution for imaging and higher substrate sputtering rates (at lower spatial resolutions) during milling. However, since for the imaging mode so much of the beam current strikes the beam-defining aperture, undesirable aperture erosion may occur. An advantage of this approach is the simplicity of the ion source and column. A clear disadvantage is the fact that imaging may also produce appreciable substrate milling (over the area of the raster pattern), thereby inducing undesirable damage to areas not intended to be milled—such damage may be unacceptable for many applications such as milling of semiconductor devices and MEMS structures.

SUMMARY OF THE INVENTION

An object of the invention is to configure a focused charged particle beam system to be capable of selectively operating in multiple modes.

Each mode is characterized by stored operating parameters. When a mode is selected by an operator or selected by preprogrammed instructions, the system sets the operating parameters of the charged particle beam source in accordance with the stored values. In one embodiment, the system includes a plasma ion source, and the plasma source operating parameters may include, for example, the plasma chamber gas, the gas pressure in the plasma chamber, the power supplied to the plasma, and the voltages on the source and extractor electrodes (which control the extraction gap voltage). In some embodiments, column operating parameters, such as the beam-defining aperture or lens voltage, also set in accordance with the selected mode.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which:

FIG. 8A shows a schematic diagram of a focused charged particle beam column employing a moving beam defining aperture assembly operating in a bulk milling mode.

FIG. 8B shows a schematic diagram of a focused charged particle beam column employing a moving beam defining aperture assembly operating in a fine resolution milling mode.

FIG. 10A shows a schematic diagram of a focused charged particle beam column employing an electronically variable aperture operating in a bulk milling mode.

FIG. 10B shows a schematic diagram of a focused charged particle beam column employing an electronically variable aperture operating in a fine resolution milling mode.

DETAILED DESCRIPTION OF PREFERRED EMBODIMENTS

Figure 1:
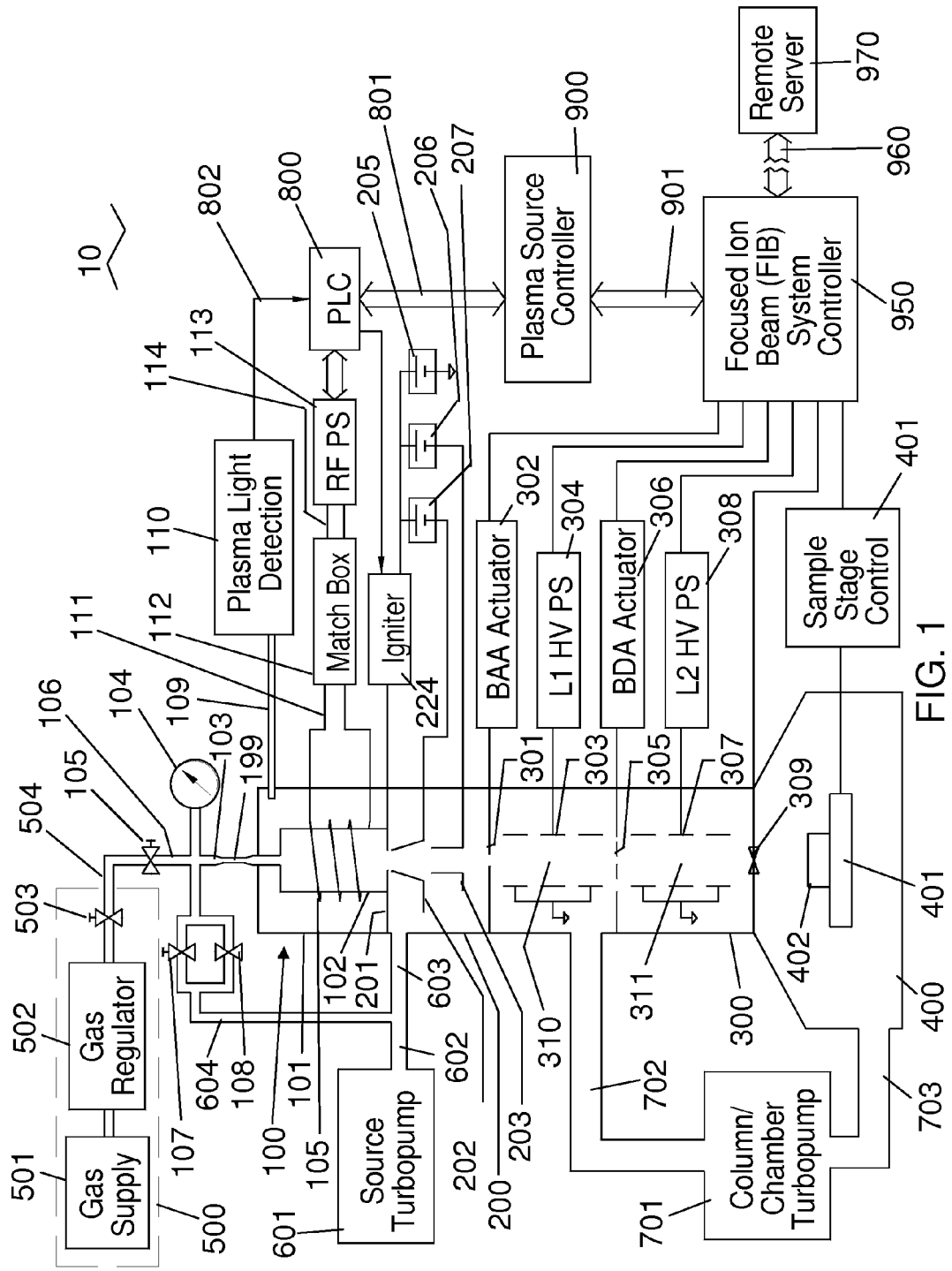
FIG. 1 shows a schematic diagram of an ion beam system capable of implementing combined milling and imaging processes.

The present invention applies to charged particle beam systems switchable between multiple operating modes, each operating mode being characterized by a set of stored operating parameters. System operating parameters include source operating parameters, which characterize the operation of the charged particle beam source, and column operating parameters, which characterize the operation of the focusing column. Embodiments of the invention are capable of both processing a substrate (by milling or depositing material), and imaging a substrate surface to provide a maximum rate of processing (to reduce overall processing times) combined with a means of imaging the substrate surface periodically during the milling surface. This imaging process preferably has minimal or no milling or deposition effect on the substrate surface and should enable the rapid acquisition of images with sufficient signal-to-noise to allow for accurate evaluation of the progress of the milling or deposition process. Accurate imaging provides the endpoint detection capability for the milling or deposition process—i.e., enabling the milling to be neither too shallow nor too deep compared with the predetermined milling depth specifications, or the deposition to be neither too thin nor too thick compared with the predetermined deposition thickness specifications. That is, the work piece is processed in an operating mode that is optimized for processing, and the processing results can be observed by changing to a different operating mode that is optimized for imaging. Depending on what is shown in the image, the system can, for example, return to the same processing mode to continue processing, switch to a different processing mode, such as a slower, higher resolution processing mode, or cease processing.

One embodiment of the present invention provides two operating modes in a focused ion beam system employing an inductively-coupled plasma (ICP) ion source, wherein an "imaging" mode is generally used for imaging and milling of fine structures on the surface of a substrate, and a "milling" mode is generally used for more rapid bulk milling of material from the same substrate. The ICP source forms a virtual ion source that is imaged at or near the surface of the substrate by an ion column comprising one or more ion lenses. The ion column lenses are typically round electrostatic lenses, but may alternatively be round magnetic lenses or combinations of two or more electrostatic or magnetic quadrupoles configured to give a net focusing effect in all directions perpendicular to the optical axis.

The system operating modes are each characterized by a set of operating parameters, which may include source operating parameters, such as the radio frequency (RF) power to the ICP ion source, the gas pressure in the ICP ion source enclosure, and the extraction gap voltage. For some embodiments, other parameters may also be varied between the imaging and milling modes, such as column operating parameters, including the focusing voltages on lenses in the ion column or the particular beam-defining aperture used to define the beam half-angle at the substrate. In some embodiments, the selection of operating mode is determined solely by the choice of RF power to the ICP ion source. In other embodiments, two or more parameters may be varied to select the imaging or milling operating mode, wherein one of these parameters is the RF power to the ICP ion source.

In one embodiment, a system provides beam-induced milling or imaging of a substrate using a focused ion beam system employing a plasma source, such as an inductively-coupled plasma (ICP) ion source that produces a high energy ion beam which is subsequently focused at or near the surface of a substrate by an ion column. The design of ICP ion sources is familiar to those skilled in the art. An example of an inductively-coupled plasma ion source is provided in U.S. Pat. No. 7,241,361, issued Jul. 10, 2007, and incorporated by reference herein.

The ion column focuses an image of a virtual source formed by the ICP ion source at or near the surface of a substrate on which a predetermined pattern is to be milled by ion sputtering. The ion column comprises one or more ion lenses which are typically electrostatic lenses comprising two or more electrodes to which voltages are applied to create focusing electrostatic fields. As the ion beam formed by the ICP source passes through these lenses, the ions in the beam are deflected towards the optical axis of the ion column, to produce a net positive focusing effect. Alternative ion lenses may comprise two or more magnetic pole pieces, wherein a strong magnetic field is generated between these pole pieces by a magnetic coil or by permanent magnets. Still other alternative ion lenses may comprise combinations of two or more quadrupoles in a "strong focusing" configuration. "Strong focusing" in lens design means a focusing effect which is first-order in the field strengths, not second-order as is the case for electrostatic or magnetic round lenses. In some embodiments, the quadrupoles can be electrostatic, comprising four or more electrodes connected to high voltage supplies. In other embodiments, these quadrupoles may be magnetic, comprising four or more pole pieces, each energized by a magnetic coil. The designs of these various types of ion lenses are familiar to those skilled in the art.

When the focused ion beam strikes the substrate surface, the high energy and high atomic weight of the ions causes sputtering of atoms from the substrate surface, in a process called "milling". Depending on the ion species (particularly, the atomic weight) and the energy of the ions, as well as the composition of the substrate, the rate of ion milling will vary over a wide range. The milling rate can be increased or the selectivity of milling can be improved through the use of various combinations of precursor gases in the presence of the ion beam. In many cases, the milling rate cannot be predicted to high precision. In cases where very precise milling patterns are desired (i.e., precise depths of material removal), it may be necessary to image the substrate surface during various stages in the milling process to determine how much material has already been removed, and thus how much remains to be removed to achieve the desired depth of milling. This process of imaging the substrate may occur concurrently in the milling mode or as a separate operating mode of the ion source and ion column, with different operating parameters than those used for the ion source and ion column during the milling operation.

During the milling mode, the ion beam will be moved to various positions on the substrate surface corresponding to the predetermined pattern to be milled. In some cases, different parts of the pattern will require different milling depths. In other cases, the pattern will be milled to the same depth. The milling depth is generally a monotonically-increasing function of the milling time, but not necessarily directly proportional to the milling time due to factors such as variations in the composition of the substrate with depth, or redeposition effects (i.e., milled material removed from one area redeposits on another part of the pattern being milled). For the milling mode, the most desirable source operation characteristics are high angular intensity and high source brightness. A milling mode preferably provides a beam current of between 50 pA and 1 mA. Milling mode current is preferably greater than about 100 pA and provides a material removal rate of preferably greater than about 0.03 $\mu m^3$/sec in silicon, more preferably a current of greater than 200 pA to provide a material removal rate of preferably greater than about 0.06 $\mu m^3$/sec in silicon, even more preferably a current of greater than about 1 nA to provide a material removal rate of preferably greater than about 0.3 $\mu m^3$/sec in silicon, and still more preferably a current of greater than 500 nA to provide a material removal rate of preferably greater than about 150 $\mu m^3$/sec in silicon.

During the imaging mode, the ion beam will generally be moved in a predetermined pattern such as an X-Y raster or serpentine pattern. When the ion beam strikes the substrate surface, a number of particles may be emitted from the area of the surface being illuminated by the ion beam, such as secondary electrons, backscattered primary beam ions, ions from the substrate material, and neutral atoms or radicals from the substrate material. These emitted particles from the substrate surface may be collected by a detector, which generates a signal which is a function of the flux of particles impinging on the detector. This signal can then be used to modulate the intensity of a display screen, such as a cathode-ray tube or flat panel display, thereby presenting an image of the substrate being milled to the operator of the focused ion beam system. Alternatively, in more automatic system configurations, the image (stored in an image memory, such as a "frame grabber") may be analyzed by image processing software with or without operator intervention. The image analysis so produced may then be used to determine whether the milling process is complete, or to provide an estimate of the milling time remaining. For the imaging mode, the most desirable source performance will demonstrate low energy spreads of the ions emerging from the ICP ion source, coupled with high reduced source brightness resulting from small virtual source sizes. These source characteristics enable the generation of fine low current ion probes at the surface for optimized imaging. Thus for the imaging mode it is desirable to limit the current impinging on the specimen. Beam current in imaging mode is preferably less than 200 pA, more preferably less than about 100 pA, and typically between 1 pA and 100 pA.

Embodiments of the present invention optimize the overall FIB system performance by varying the operating parameters of the ICP ion source and also (for some embodiments) the ion column operating parameters, to meet the above requirements for optimized milling, deposition, or imaging processes. Selection of the operating mode may be done either manually by the FIB system operator through a user interface, or automatically by the FIB system controller. Once the operating mode is selected, the system preferably automatically adjusts the system to the operating parameters stored for the selected mode. Optimization of the FIB system performance may include both considerations of tool lifetime between required maintenance (such as aperture replacement) as well as the beam characteristics at or near the substrate surface. An example of tool lifetime optimization would be the reduction of the source emission current to lower levels in order to minimize sputter damage to apertures. Beam characteristics at or near the substrate surface could include the beam energy, beam current, and beam diameter, as well as the beam species (electrons, atomic ions, or molecular ions), the ion charge polarities (positive or negative), and the ion charge states (singly- or doubly-ionized).

FIG. 1 shows a schematic of an ion beam system 10 capable of implementing multiple user selectable modes. The description below described for illustrative purposes a system implementing two modes for milling and imaging processes. At the top of the ion column, an inductively-coupled plasma (ICP) ion source 100 is mounted, comprising an electromagnetic enclosure 101, a source chamber 102, and an induction coil 105. A radio frequency (RF) power supply 113 is connected to a match box 112 by two radio frequency (RF) coaxial cables 114. The match box 112 is connected to the induction coil 105 by two RF coaxial cables 111. The induction coil 105 is mounted coaxially with the source chamber 102. To reduce electrostatic coupling between the induction coil 105 and the plasma generated within the source chamber 102, a split Faraday shield (not shown) may optionally be mounted coaxially with the source chamber 102 and inside the induction coil 105. When a split Faraday shield is used in the ICP ion source 100, the high voltage (typically several hundred volts) across the induction coil 105 will have minimal effect on the energies of the ions extracted from the bottom of the ICP ion source 100 into the ion column. This will result in smaller beam energy spreads, reducing the chromatic aberration in the focused charged particle beam at or near the substrate surface.

The presence of a plasma within the source chamber 102 may be detected using the light emitted by the plasma and collected by the inner end of optic fiber 109, and transmitted through optic fiber 109 to a plasma light detection unit 110. An electrical signal generated by the plasma light detection unit 110 is conducted through cable 802 to a programmable logic controller (PLC) 800. The plasma on/off signal generated by the plasma light detection unit 110 then passes from the PLC 800 through cable or data bus 801 to the plasma source controller 900 executing plasma source control software. Signals from the plasma source controller 900 may then pass through cable or data bus 901 to the focused ion beam (FIB) system controller 950. The FIB system controller 950 may communicate via the Internet 960 to a remote server 970. These details of the interconnections of the various components of the FIB system control are for exemplary purposes only. Other control configurations are possible as is familiar to those skilled in the art.

The gas pressure within the source chamber 102 is controlled by a gas feed system 500 and a pumpout system as shown in FIG. 1. A source turbopump 601 pumps through a common vacuum line 602 to two vacuum lines: a first vacuum line 603 to the ICP source extraction optics chamber 200, and a second vacuum line 604 leading to the inlet gas line 103 to the source chamber 102. The gas pressure within the inlet gas line 103 is monitored by an inlet line pressure gauge 104. The signal from the inlet line pressure gauge 104 is connected to the programmable logic controller 800 by a cable (not shown). As shown, the vacuum pumping from the source turbopump 601 to the inlet line 103 may go through a (regulating) needle valve 107 or a stop (non-regulating) valve 108. Pumping through needle valve 107 enables very slow and controlled continuous pumping of the inlet gas line 103. Pumping through stop valve 108 is useful for initial pumping down of the system. Inlet gas line 103 leads to inlet capillary 199, which leads to the interior of the source enclosure 102.

A gas supply system 500 to the ICP source comprises a gas supply 501, a high purity gas regulator 502, and a needle (regulating) valve 503. The gas supply 501 may comprise a standard gas bottle with one or more stages of flow regulation, as would be the case for Helium, Oxygen, Xenon or Argon feed gases, for example. Alternatively, for gases derived from compounds which are solid or liquid at room temperature, gas supply 501 may comprise a heated reservoir. Other types of gas supplies 501 are also possible. The particular choice of gas supply 501 configuration is a function of the type of gas to be ionized in the ICP source. Gas from supply 501 passes through a high purity gas regulator 502, which may comprise one or more stages of purification and pressure reduction. The flow rate of the purified gas emerging from high purity gas regulator 502 is controlled by a needle valve 503. Gas emerging from needle valve 503 passes through an all-metal hose 504 to a second needle valve 105, mounted in close proximity to the ICP source. Gases emerging from needle valve 105 pass through the inlet line 106 to the point where the gas pressure in inlet gas line 106 is measured by inlet line pressure gauge 104—this is the same gauge used to measure the inlet line pressure during initial pump down of the inlet gas line 103. Inlet gas line 103 connects through capillary 199 to the top of the source chamber 102. These details of the gas feed system and pumpdown system for the ICP source are for exemplary purposes only. Many other gas feed and pumpdown configurations are possible as is familiar to those skilled in the art.

At the bottom of the ICP source 100, a source electrode 201 serves as part of the ion beam extraction optics, working in conjunction with the extractor electrode 202 and the condenser 203. A plasma igniter 224 is connected to the source electrode 201, enabling the starting of the plasma in the source enclosure 102. Other known means of igniting the plasma can also be used. Details of the operation of the ICP source are provided in U.S. Pat. No. 7,241,361, issued Jul. 10, 2007, incorporated by reference herein.

The source electrode 201 is biased through the igniter 224 to a high voltage by beam voltage power supply (PS) 205. The voltage on the source electrode 201 determines the energy of the ions reaching the substrate surface in the case of singly-ionized atomic or molecular ion species. Doubly-ionized ion species will have twice the kinetic energy. The extractor electrode 202 is biased by extractor power supply 207, while the condenser 203 is biased by condenser power supply 206. The combined operation of the source electrode 201, the extractor 202, and the condenser 203 serves to extract and focus ions emerging from the ICP source 100 into a beam which passes to the beam acceptance aperture 301. The beam acceptance aperture 301 is mechanically positioned within the ion column by the beam acceptance aperture actuator 302, under control of the FIB system controller 950. Typical voltage settings may be roughly +30 kV for power supply 205, roughly −15 kV for power supply 206 and roughly −15 kV for power supply 207.

The ion column illustrated in FIG. 1 shows two electrostatic einzel lenses 310 and 311, used to form a highly demagnified (roughly $1/125\times$) image of the virtual source in the ICP source 100 at or near the surface of substrate 402, mounted on stage 401. The first einzel lens, 310, referred to as "lens 1" or "L1," is located directly below the beam acceptance aperture 301 and comprises three electrodes with the first and third electrodes being grounded (at 0V), while the voltage of the center electrode 303 is controlled by lens 1 (L1) power supply (PS) 304. The lens 1 power supply 304 is controlled by the FIB system controller 950.

Between the first einzel lens 310 and the second einzel lens 311 in the ion column, a beam defining aperture assembly 305 is mounted, comprising one or more beam defining apertures (three apertures are shown in FIG. 1). Typically, the beam defining aperture assembly 305 would comprise a number of circular apertures with differing diameter openings, where any one of which could be positioned on the optical axis to enable control of the beam current and half-angle at the substrate surface. Alternatively, two or more of the apertures in the beam defining aperture assembly 305 may be the same, thereby providing redundancy to enable the time between aperture maintenance cycles to be extended. By controlling the beam half-angle, the beam current and diameter of the focused ion beam at or near the substrate surface may be selected, based on the spatial resolution requirements of the milling or imaging operations to be performed. The particular aperture to be used (and thus the beam half-angle at the substrate) is determined by mechanical positioning of the desired aperture in the beam defining aperture assembly 305 on the optical axis of the column by means of the beam defining aperture (BDA) actuator 306, controlled by the FIB system controller 950.

Beneath the beam defining aperture assembly 305, the second einzel lens 311, referred to as "lens 2" it "L2," is shown. The first and third electrodes are grounded (0 V), while the voltage of the center electrode 307 is controlled by lens 2 (L2) power supply (PS) 308. The lens 2 power supply 308 is controlled by the FIB system controller 950.

At the lower end of the ion column, a column/chamber isolation valve 309 is positioned. Isolation valve 309 enables the vacuum in the ion column vacuum chamber 300 to be maintained at high levels, even if the vacuum level in the source chamber 400 is adversely affected by sample outgassing, during sample introduction and removal, or for some other reason. A source/chamber turbopump 701 is configured to pump the sample chamber 400 through a pumping line 703. Turbopump 701 also pumps the ion column enclosure 300 through pumping line 702.

As an example, when the gas feed system 500 is supplying Xenon to the ICP ion source 100, variation in the gas pressure in the source chamber 102 results in changes to the virtual source position. Variation in the RF power to the ICP ion source causes changes to the virtual source size. Separate manual calibration of the system operating in both the milling and imaging modes may be used to determine the optimum operating parameters for each mode, including gas feed pressure, RF power, and extraction gap voltage. For each source gas, such as Xenon, Argon, etc., two separate sets of optimum operating parameters would be generated, one set each for milling and for imaging. Once these optimum parameters have been determined, the system can be switched back and forth between milling and imaging either manually or under the automatic control of the FIB system controller 950.

As an example, for the FIB system operating with Xenon gas, the optimum imaging mode might utilize low RF input power (e.g., 400-500 W), low filling pressure (giving the highest possible source brightness with minimum total source emission current). The optimum milling mode might utilize high input RF power (e.g., 800-1000 W) and a medium gas filling pressure (giving a high angular intensity with moderate source brightness).

The details of the FIB system illustrated in FIG. 1 are for exemplary purposes only—many other FIB system configurations are capable of implementing a multiple mode embodiment of the present invention for milling and imaging. For example, the ion column illustrated in FIG. 1 shows two electrostatic einzel lenses. The ion column may alternatively be implemented using a single electrostatic einzel lens, or more than two electrostatic lenses. Other embodiments might include magnetic lenses or combinations of two or more electrostatic or magnetic quadrupoles in strong-focusing configurations. For the purposes of this embodiment of the present invention, it is preferred that the ion column forms a highly demagnified image of the virtual source (in the ICP source 100) at or near the surface of the substrate 402. Details of these possible demagnification methods are familiar to those skilled in the art.

Figure 2:
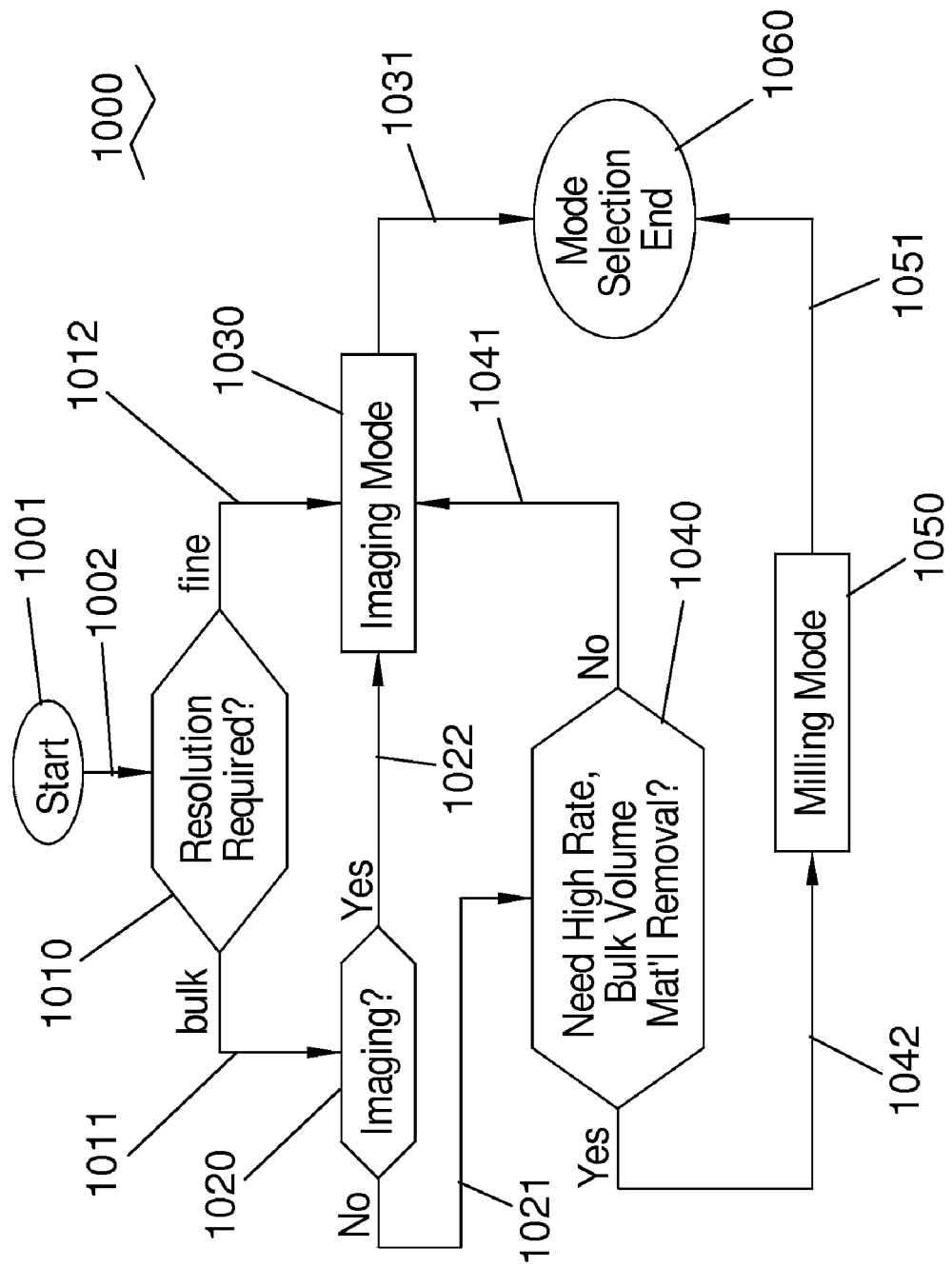
FIG. 2 shows a flow chart for selecting an appropriate operating mode for the ion beam system of FIG. 1.
Figure 4:
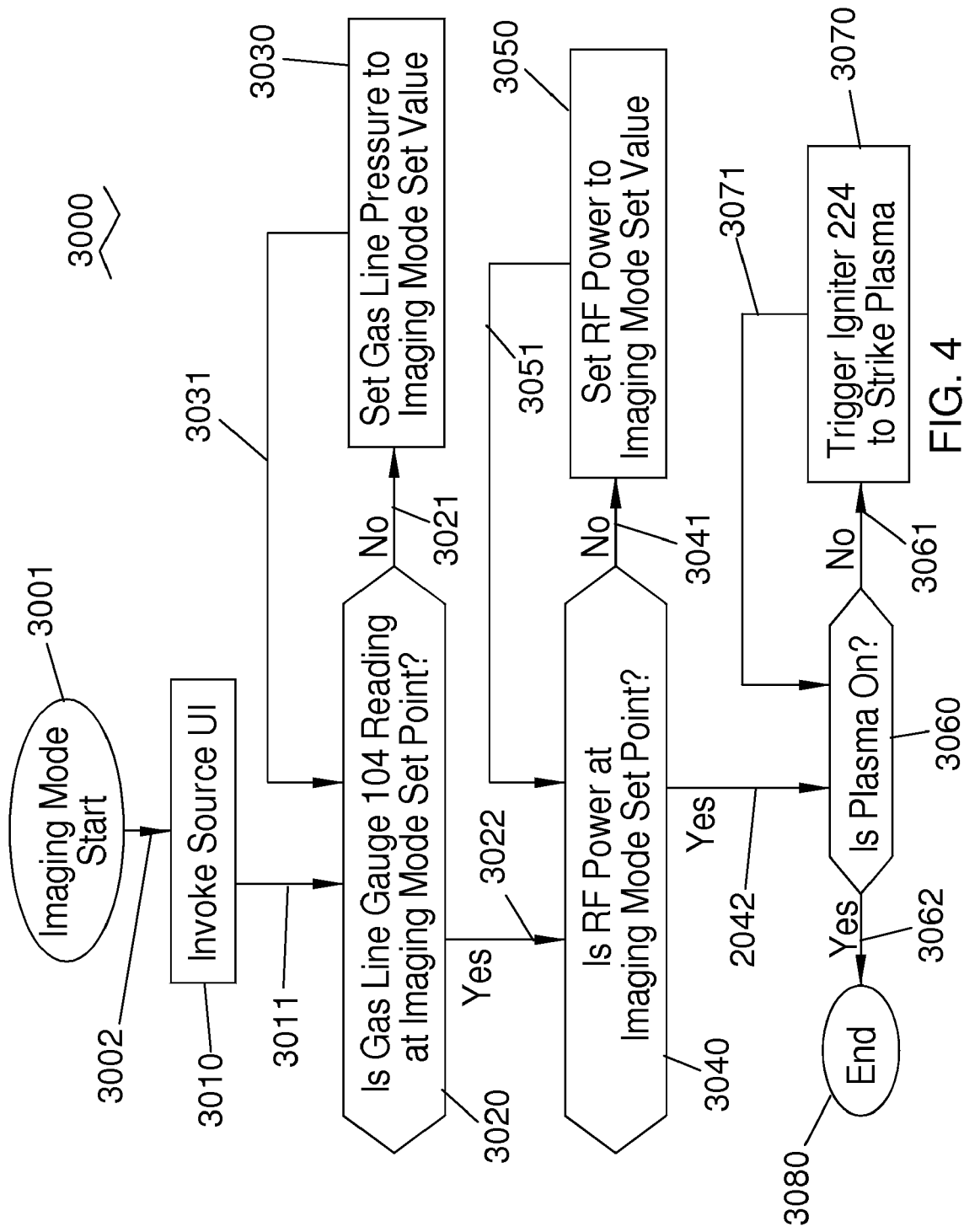
FIG. 4 shows a flow chart for setting up the operating parameters of an imaging mode in the ion beam system of FIG. 1.

FIG. 2 shows a flow chart 1000 for selecting an appropriate operating mode for a FIB system, such as FIB system 10 of FIG. 1. The decision path starts at block 1001, with branch 1002 leading to decision block 1010 where the required resolution is determined—either "bulk" (i.e., relatively large beams with low spatial resolutions), or "fine" (i.e., relatively small beams with high spatial resolutions). While the term resolution is typically related to the ability to resolve points in an image, the term is used herein in as a measure of the ability of the system to create fine structures. If the required resolution is "fine", branch 1012 is selected, leading to imaging mode block 1030. If the required resolution is "bulk", branch 1011 is selected, leading to a second decision block 1020 where a determination is made of whether imaging is needed. If imaging is required, branch 1022 is selected, leading to imaging mode block 1030. Imaging block 1030 sets a number of parameters within the plasma source controller 900 (see FIG. 1) and within the FIB system controller 950 (see FIG. 1). The parameters set by imaging mode block 1030 may include the required RF power for the ICP source 100, the gas pressure within source enclosure 102, the extraction gap voltage, the beam defining aperture 305 to be mechanically positioned on the optical axis, and/or the settings of the lenses within the ion column (for example, in FIG. 1, the voltages on electrodes 303 and 307). FIG. 4 is a flow chart illustrating one embodiment of the parameter definition process within Imaging Mode block 1030.

Figure 3:
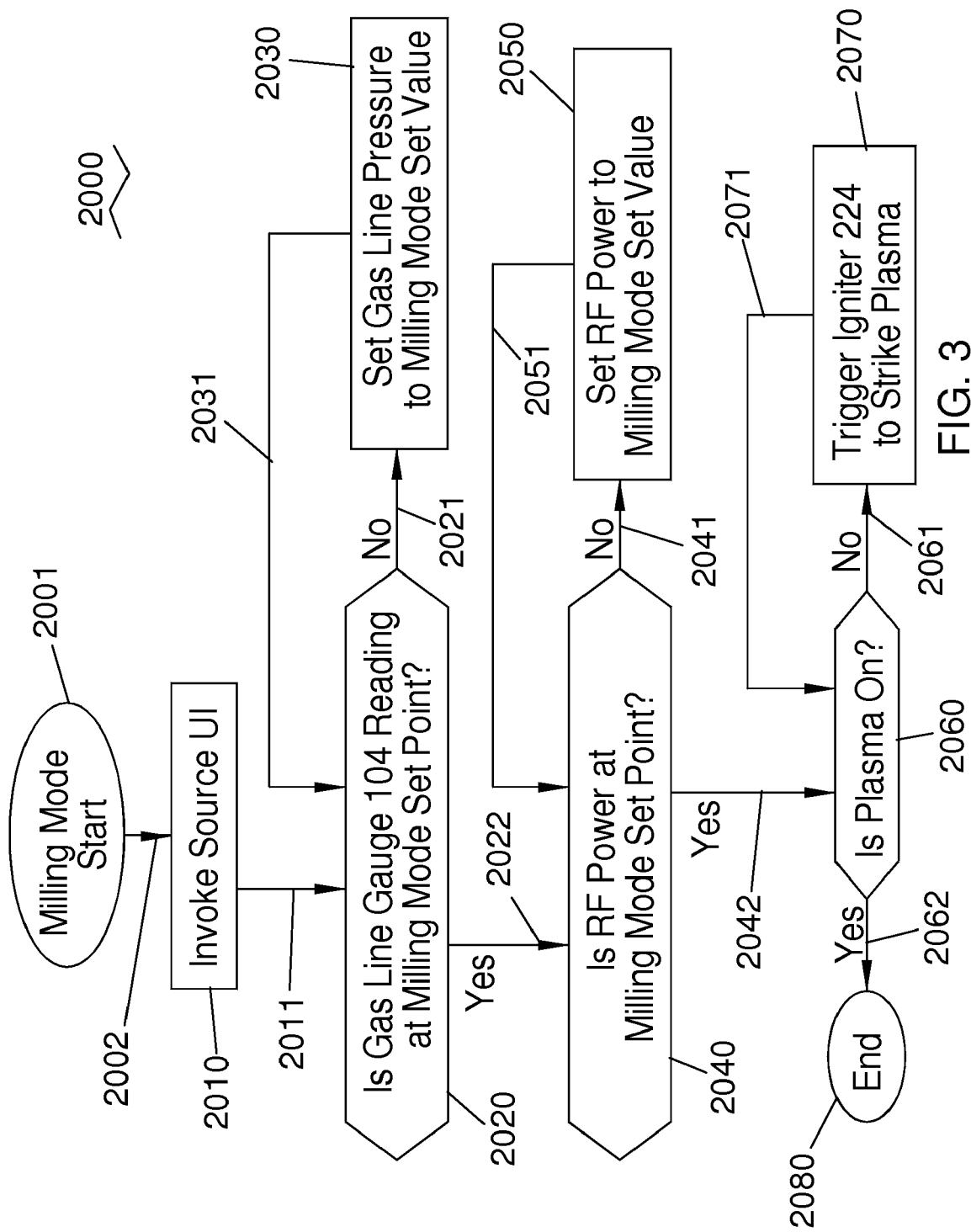
FIG. 3 shows a flow chart for setting up the operating parameters of a milling mode in the ion beam system of FIG. 1.

If imaging is not required in block 1020, branch 1021 is selected, leading to a third decision block 1040 where a determination of whether high rate, bulk volume material removal is required. If high rate, bulk volume material removal is not required, branch 1041 is selected, leading to imaging mode block 1030, where the imaging mode operating parameters are specified as described above. If high rate, bulk volume material removal is required, branch 1042 is selected, leading to milling mode block 1050. Milling mode block 1050 sets the same source and column parameters as imaging block 1030, except the values of these parameters are those required for high rate, bulk volume material removal, instead of for imaging. FIG. 3 is a flow chart illustrating one embodiment of the parameter definition process within Milling Mode block 1050. Exiting from Milling Mode block 1050, branch 1051 leads to the Mode Selection End block 1060. Exiting from Imaging Mode block 1030, branch 1031 also leads to the Mode Selection End block 1060. Skilled persons an readily extend the flow chart of FIG. 2 to cover more than two modes.

FIG. 3 shows a flow chart 2000 for setting up the operating parameters of a milling mode in the focused ion beam system of FIG. 1 in one embodiment of the present invention. Block 2001 is the Milling Mode Start block, leading through branch 2002 to the Invoke Source controller block 2010—this block represents a signal to the plasma source controller 900 (see FIG. 1) that a process for setting up the system operating parameters for the milling mode is beginning. Communication through cable or data bus 901 to the FIB system controller 950 (see FIG. 1) may also initiated at this point, since, for some embodiments, some column operating parameters (electrode voltages and/or beam defining aperture selections) may also be functions of the particular operating mode (milling or imaging) required.

Once the source controller has been invoked by block 2010, branch 2011 is followed to a first decision block 2020 where the gas line gauge 104 (see FIG. 1) reading is compared with a predetermined gas line pressure set point for the milling mode. If the gas line pressure is not at the milling mode set point, branch 2021 is taken to block 2030, where the gas line pressure is reset to the predetermined milling mode set point. Branch 2031 exiting from block 2030 leads back to decision block 2020, where the gas line pressure is again compared with the predetermined milling mode set point. This comparison process loops around from block 2020 to block 2030 and then back to block 2020 until the gas line pressure is at the correct predetermined milling mode set point. After a predetermined number of loops between blocks 2020 and 2030, if the gas line pressure is not yet at the predetermined milling mode set point, the system may be configured to abort the milling mode set-up procedure and alert the system operator and/or FIB system controller 950.

When the gas line pressure is at the correct predetermined milling mode set point, branch 2022 is taken, leading to a second decision block 2040. In block 2040, the radio frequency (RF) power is compared with a predetermined set point for the milling mode, typically in a range from 800 to 1000 W for the ICP source illustrated in FIG. 1. The frequency of the RF power is typically 13.56 MHz, or an integral multiple of 13.56 MHz, or some other radio frequency as is familiar to those skilled in the art. Choices of radio frequencies are familiar to those skilled in the art. If the RF power is not at the milling mode set point, branch 2041 is taken to block 2050, where the RF power is reset to the predetermined milling mode set point. Branch 2051 exiting from block 2050 leads back to decision block 2040, where the RF power is again compared with the predetermined milling mode set point. This comparison process loops around from block 2040 to block 2050 and then back to block 2040 until the RF power is at the correct predetermined milling mode set point. After a predetermined number of loops between blocks 2040 and 2050, if the RF power is not yet at the predetermined milling mode set point, the system may be configured to abort the milling mode set-up procedure and alert the system operator and/or FIB system controller 950. In an alternative embodiment, another type of plasma source 100 may be used. Examples of such alternative plasma sources include dc plasma sources, and capacitively coupled RF plasma sources.

When the RF power is at the correct predetermined milling mode set point, branch 2042 is taken, leading to a third decision block 2060. In block 2060, an evaluation is made of whether the plasma is on. This evaluation may be made using the reflected power going back into the RF power supply 113 from the match box 112 (see FIG. 1), and/or from the signal on line 802 leading from the plasma light detection system 110 which looks at the light from the plasma in the source chamber 102 through optic fiber 109, as illustrated in FIG. 1. Other means for determining whether the plasma is ignited are also possible as is familiar with those skilled in the art. For improved reliability, two or more methods may be used in parallel for detection of the plasma in the source chamber 102. If the plasma is off, branch 2061 is followed, leading to block 2070, where the igniter 224 connected to the source electrode 201 is activated to strike a plasma within source chamber 102. Plasma ignition can be manual or automatic. In a manual mode, an operator can be informed of the absence of plasma in the plasma chamber, and the operator can ignite the plasma by contacting a Tesla coil or some similar device to the plasma chamber. After activating igniter 224, branch 2071 is followed back to decision block 2060, where a determination is again made whether there is a plasma in the source chamber 102. This plasma monitoring process loops around from block 2060 to block 2070 and back to block 2060 until a plasma is detected in the source chamber 102 by one or more of the means discussed above. After a predetermined number of loops between blocks 2060 and 2070, if there is still no plasma in the source chamber 102, the system may be configured to abort the milling mode set-up procedure and alert the system operator and/or FIB system controller 950. Once a plasma is detected in source chamber 102, branch 2062 is followed to End block 2080. The method of FIG. 3 may be performed automatically in accordance with computer instructions stored on computer readable media, such as a computer's random access memory accessible to plasma source controller 900 and FIB system controller 950. The computer instructions may also be stored on optical, magnetic, or semiconductor media, such as a compact disk, a DVD, a storage disk, or a flash memory.

FIG. 4 shows a flow chart 3000 for setting up the operating parameters of an imaging mode in the focused ion beam system of FIG. 1 in one embodiment of the present invention. Block 3001 is the Imaging Mode Start block, leading through branch 3002 to the Invoke Source Controller block 3010—this block represents a signal to the plasma source controller 900 (see FIG. 1) that a process for setting up the system operating parameters for the imaging mode is beginning. Communication through cable or data bus 901 to the FIB system controller 950 (see FIG. 1) may also initiated at this point, since, for some embodiments, some column operating parameters (electrode voltages and/or beam defining aperture selections) may also be functions of the particular operating mode (milling or imaging) required.

Once the source controller has been invoked by block 3010, branch 3011 is followed to a first decision block 3020 where the gas line gauge 104 (see FIG. 1) reading is compared with a predetermined gas line pressure set point for the imaging mode. If the gas line pressure is not at the imaging mode set point, branch 3021 is taken to block 3030, where the gas line pressure is reset to the predetermined imaging mode set point. Branch 3031 exiting from block 3030 leads back to decision block 3020, where the gas line pressure is again compared with the predetermined imaging mode set point. This comparison process loops around from block 3020 to block 3030 and then back to block 3020 until the gas line pressure is at the correct predetermined imaging mode set point. After a predetermined number of loops between blocks 3020 and 3030, if the gas line pressure is not yet at the predetermined imaging mode set point, the system may be configured to abort the imaging mode set-up procedure and alert the system operator and/or FIB system controller 950.

When the gas line pressure is at the correct predetermined imaging mode set point, branch 3022 is taken, leading to a second decision block 3040. In block 3040, the radio frequency (RF) power is compared with a predetermined set point for the imaging mode, typically in a range from 400 to 500 W for the ICP source illustrated in FIG. 1. The frequency of the RF power may be 13.56 MHz, or an integral multiple of 13.56 MHz, or some other radio frequency as is familiar to those skilled in the art. If the RF power is not at the imaging mode set point, branch 3041 is taken to block 3050, where the RF power is reset to the predetermined imaging mode set point. Branch 3051 exiting from block 3050 leads back to decision block 3040, where the RF power is again compared with the predetermined imaging mode set point. This comparison process loops around from block 3040 to block 3050 and then back to block 3040 until the RF power is at the correct predetermined imaging mode set point. After a predetermined number of loops between blocks 3040 and 3050, if the RF power is not yet at the predetermined imaging mode set point, the system may be configured to abort the imaging mode set-up procedure and alert the system operator and/or FIB system controller 950.

When the RF power is at the correct predetermined imaging mode set point, branch 3042 is taken, leading to a third decision block 3060. In block 3060, an evaluation is made of whether the plasma is on. This evaluation may be made using the reflected power going back into the RF power supply 113 from the match box 112 (see FIG. 1), and/or from the signal on line 802 leading from the plasma light detection system 110 which looks at the light from the plasma in the source chamber 102 through optic fiber 109, as illustrated in FIG. 1. Other means for determining whether the plasma is ignited are also possible as is familiar with those skilled in the art. For improved reliability, two or more methods may be used in parallel for detection of the plasma in the source chamber 102. If the plasma is off, branch 3061 is followed, leading to block 3070, where the igniter 224 connected to the source electrode 201 is activated to strike a plasma within source chamber 102. Plasma ignition can be manual or automatic. In a manual mode, an operator can be informed of the absence of plasma in the plasma chamber, and the operator can ignite the plasma by contacting a Tesla coil or some similar device to the plasma chamber. After activating igniter 224, branch 3071 is followed back to decision block 3060, where a determination is again made whether there is a plasma in the source chamber 102. This plasma monitoring process loops around from block 3060 to block 3070 and back to block 3060 until a plasma is detected in the source chamber 102 by one or more of the means discussed above. After a predetermined number of loops between blocks 3060 and 3070, if there is still no plasma in the source chamber 102, the system may be configured to abort the imaging mode set-up procedure and alert the system operator and/or FIB system controller 950. Once a plasma is detected in source chamber 102, branch 3062 is followed to End block 3080. The method of FIG. 4 may be performed automatically in accordance with computer instructions stored on computer readable media, such as a computer's random access memory accessible to plasma source controller 900 and FIB system controller 950. The computer instructions may also be stored on optical, magnetic, or semiconductor media, such as a compact disk, a DVD, a storage disk, or a flash memory.

The parameter monitoring and resetting steps illustrated in FIG. 3 for the milling mode and in FIG. 4 for the imaging mode represent one embodiment of the present invention for which the operating mode parameters are the gas pressure and the RF power. For other embodiments, various other parameters may be varied between various operating modes. For the focused ion beam column illustrated in FIG. 1, comprising an inductively-coupled plasma ion source and an ion column with two electrostatic einzel lenses, a representative set of operating parameters could comprise the following:

A) Gas line pressure—monitored with gas line gauge 104
B) RF power to the ICP source 100
C) Voltage on the source electrode 201—determines the beam energy at the substrate
D) Voltage on the extractor electrode 202
E) Voltage on the condenser electrode 203
F) Voltage on the lens 1 center electrode 303
G) Selection of the beam-defining aperture 305
H) Voltage on the lens 2 center electrode 307

The particular set of operating parameters A) through H) applies to the source and column configuration shown in FIG. 1. For other column designs, similar sets of operating parameters would apply. For example, in a column with two magnetic lenses instead of two electrostatic lenses, F) and H) would select the currents on the lens 1 and 2 excitation coils, respectively. If the ion column had more than two electrostatic lenses, then additional lens voltages would be part of the set of operating parameters.

For FIB columns employing liquid metal sources, the method of some embodiments of the present invention would apply, however parameter A) could refer to the heater current of the filament and parameter B) could refer to the extraction voltage which induces ion emission from the liquid metal source tip. Operation of liquid metal sources is familiar to those skilled in the art. Similarly, FIB columns employing gaseous field ionization (GFI) sources may also be used in FIB systems employing the present invention.

Tables 1-3 provide preferred ranges of operating parameters and an example of a preferred set of operating parameters for three exemplary modes—a coarse milling mode in Table 1, a fine milling mode in Table 2, and an imaging mode in Table 3.

TABLE 1

| Coarse Milling Mode Operating Parameters | | | |
|---|---|---|---|
| | Preferred range | More preferred range | Example setting |
| Gas line pressure | 1 to 800 mtorr ($10^{-3}$ to 1 mbar) | 20 to 300 mtorr ($3 \times 10^{-2}$ to .4 mbar) | 100 mtorr (0.13 mbar) |
| RF Power | 10 to 2000 W | 50 to 1000 W | 800 W |
| RF Frequency | 5 to 100 MHz | 10 to 55 MHz | 40.68 MHz |
| Beam energy (voltage on source electrode) | 100 to 150000 V | 500 to 30000 V | 30000 V |
| Voltage on extractor relative to source electrode | −20 to −20000 V | −200 to −15000 V | −10000 V |
| Voltage on condenser relative to source electrode | −30000 to 30000 V | −20000 to 20000 V | 14000 V |
| Lens 1 voltage | −150000 V to +150000 V | −30000 V to +30000 V | 0 V |
| Beam-defining aperture | 1 to 1000 μm | 10 to 800 μm | 100 μm |
| Lens 2 voltage | −40000 to 40000 | 10000 to 30000 | 20000 |
| Gas Species | 1 to 227 AMU | 5 to 227 AMU | 131 AMU (Xe) |
| Beam Current | 100 pA to 1 mA | 100 pA to 100 uA | 1 uA |
| Beam spot size | 5 nm to 50 μm | 10 nm to 10 μm | 2 μm |

TABLE 1-continued

| | Coarse Milling Mode Operating Parameters | | |
|---|---|---|---|
| | Preferred range | More preferred range | Example setting |
| Source Reduced brightness | $10^2$ to $10^6$ [A/(m^2 * sr * V)] | $10^2$ to $10^6$ [A/(m^2 * sr * V)] | $10^4$ [A/(m^2 * sr * V)] |

TABLE 2

| | Fine Milling Mode Operating Parameters | | |
|---|---|---|---|
| | Preferred range | More preferred range | Example setting |
| Gas line pressure | 1 to 800 mtorr ($10^{-3}$ to 1 mbar) | 20 to 300 mtorr ($3 \times 10^{-2}$ to .4 mbar) | 80 mtorr (.11 mbar) |
| RF Power | 2 to 2000 W | 50 to 1000 W | 500 W |
| RF Frequency | 5 to 100 MHz | 10 to 55 MHz | 40.68 MHz |
| Beam energy (voltage on source electrode) | 100 to 150000 V | 500 to 30000 V | 30000 V |
| Voltage on extractor relative to source electrode | −20 to −20000 V | −200 to −15000 V | −10000 V |
| Voltage on condenser relative to source electrode | −30000 to 30000 | −20000 to 20000 | 14000 |
| Lens 1 voltage | −150000 V to +150000 V | −30000 V to +30000 V | +30000 V |
| Beam-defining aperture | 1 to 1000 μm | 10 to 800 μm | 100 μm |
| Lens 2 voltage | −40000 to 40000 | 10000 to 30000 | 20000 |
| Gas Species | 1 to 227 AMU | 5 to 227 AMU | 131 AMU (Xe) |
| Beam Current | 1 pA to 100 nA | 2 pA to 100 nA | 80 nA |
| Beam spot size | 5 nm to 50 μm | 10 nm to 10 μm | 300 nm |
| Source Reduced brightness | $10^2$ to $10^6$ [A/(m^2 * sr * V)] | $10^2$ to $10^6$ [A/(m^2 * sr * V)] | $10^4$ [A/(m^2 * sr * V)] |

TABLE 3

| | Imaging Mode Operating Parameters | | |
|---|---|---|---|
| | Preferred range | More preferred range | Example setting |
| Gas line pressure | 1 to 800 mtorr ($10^{-3}$ to 1 mbar) | 20 to 300 mtorr ($3 \times 10^{-2}$ to .4 mbar) | 70 mtorr (.093 mbar) |
| RF Power | 1 to 2000 W | 50 to 1000 W | 100 W |
| RF Frequency | 5 to 100 MHz | 10 to 55 MHz | 40.68 MHz |
| Beam energy (voltage on source electrode) | −150000 to 150000 V | 500 to 30000 V | 30000 V |
| Voltage on extractor relative to source electrode | 20000 to −20000 V | −200 to −15000 V | −10000 V |
| Voltage on condenser relative to source electrode | −30000 to 30000 | −20000 to 20000 | 14000 |
| Lens 1 voltage | −150000 V to +150000 V | −30000 V to +30000 V | +30000 V |
| Beam-defining aperture | 1 to 1000 μm | 10 to 800 μm | 50 μm |
| Lens 2 voltage | −40000 to 40000 | 10000 to 30000 | 20000 |
| Gas Specie | 1 to 227 AMU | 1 to 100 AMU | 1 AMU (Hydrogen) |
| Beam Current | 1 pA to 10 nA | 1 pA to 1 nA | 50 pA |
| Beam spot size | 5 nm to 50 μm | 10 nm to 10 μm | 60 nm |
| Source Reduced brightness | $10^2$ to $10^6$ [A/(m^2 * sr * V)] | $110^2$ to $10^6$ [A/(m^2 * sr * V)] | $10^4$ [A/(m^2 * sr * V)] |

Operating parameters may also be defined for a beam-induced deposition mode. Various embodiments of the present invention may be characterized by particular selections of one or more of the operating parameters A) through H). The flow charts in FIGS. 3 and 4 correspond to the particular choice of parameters A) and B) only, with parameters C) through H) assumed to be the same for both the milling and imaging modes. In some embodiments, different parameters can be adjusted for the different modes.

For other embodiments, parameters A) and B) could be varied to select two different operating modes for the ICP source 100, while one or more of parameters C) through E) could be varied to control the ion extraction process from the ICP source 100.

Still other embodiments might vary parameters A) and B) in conjunction with variation of one or more of parameters F) through H) to vary the ion column optics. For example, simultaneous variation of parameters F) and H) could enable operation of the FIB column in a high demagnification mode for imaging, and a lower demagnification mode for bulk material removal in the milling mode. Parameter G) might be varied in this embodiment to select differing maximum beam half-angles at the substrate for the imaging mode and the milling mode.

Figure 5:
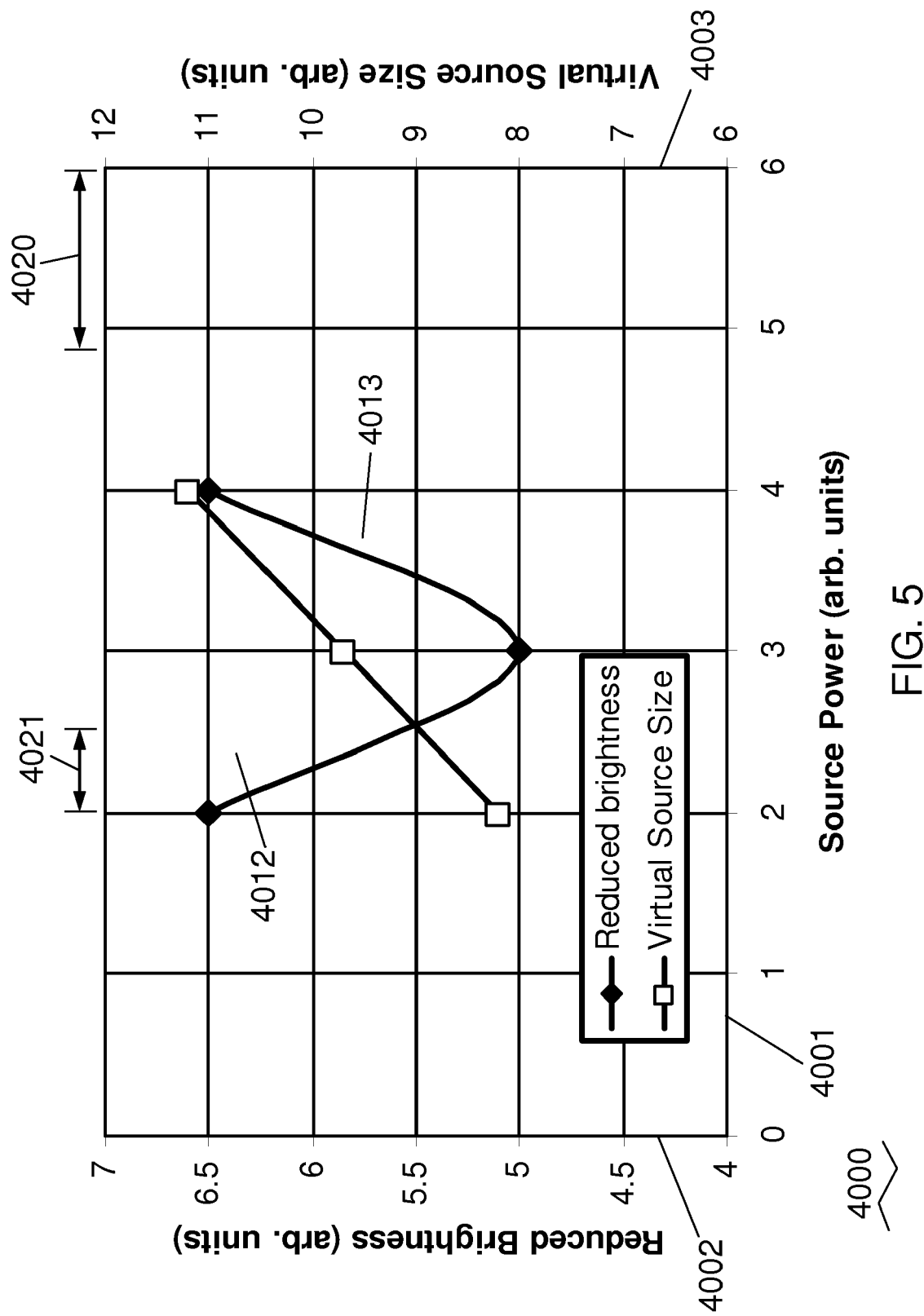
FIG. 5 shows a graph of reduced brightness and angular intensity plotted against the source power.

FIG. 5 shows a graph 4000 of reduced brightness (in arbitrary units) 4002 and angular intensity (in arbitrary units) 4003 plotted against the source power (in arbitrary units) 4001 for the ICP ion source 100 of FIG. 1. Reduced brightness is defined as the angular intensity divided by the product of the area of the virtual source and the accelerating voltage of the beam. A typical milling mode 4020 corresponds to a source power range from approximately 4.9 to approximately 6.0 in arbitrary units. A typical Imaging mode 4021 corresponds to a source power range from approximately 2.0 to approximately 2.5 in arbitrary units. Curve 4012 illustrates the variation in the reduced brightness with source power—note that within the source power ranges for both imaging 4021 and milling 4020, it is possible to achieve roughly the same reduced source brightnesses (6.5 in arbitrary units). Curve 4013 illustrates the variation in the angular intensity with source power—note that this parameter is roughly half the value (in arbitrary units) for the imaging mode 4021 as it is for the milling mode 4020.

Figure 6:
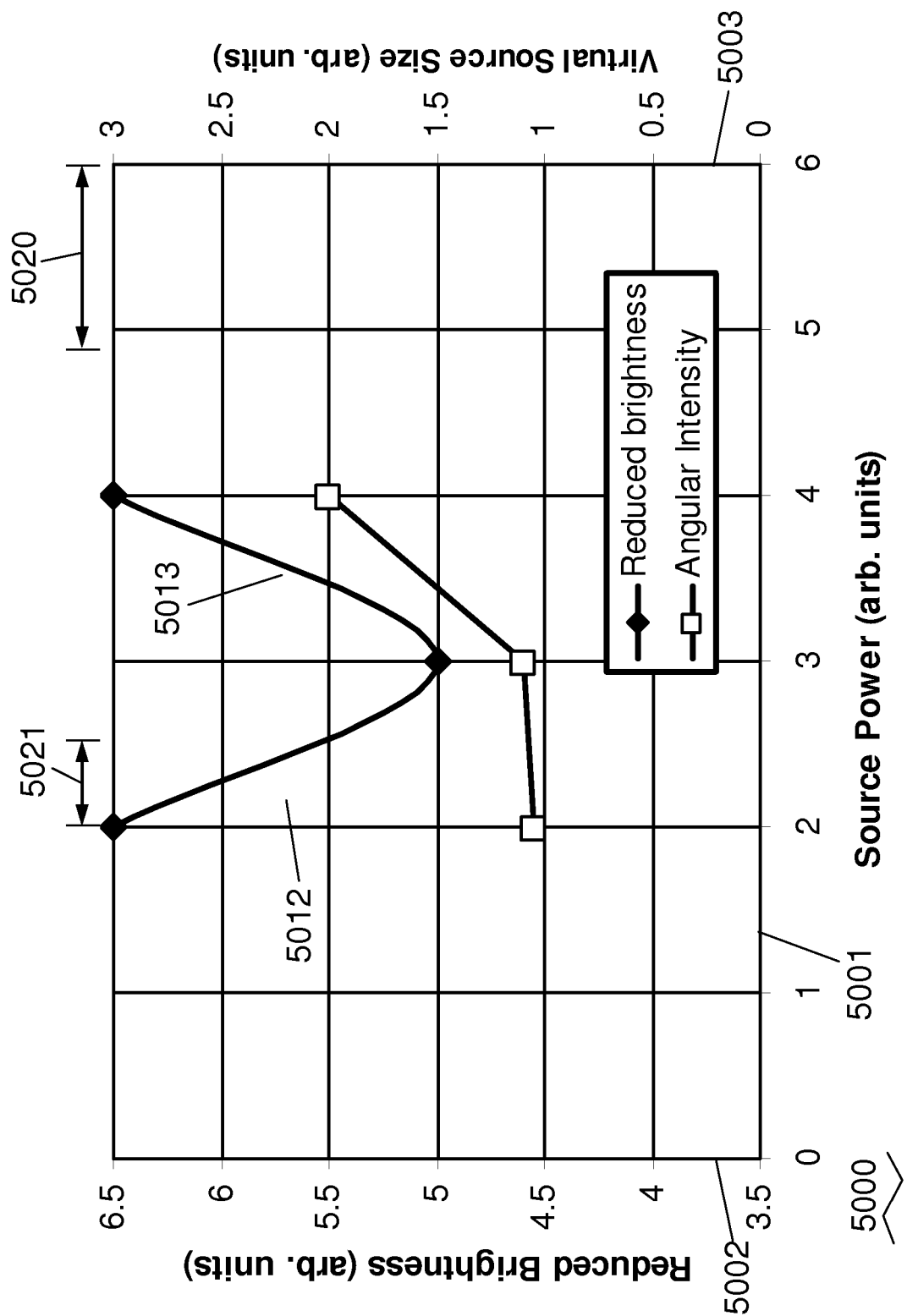
FIG. 6 shows a graph of reduced brightness and virtual source size plotted against the source power.

FIG. 6 shows a graph 5000 of reduced brightness (in arbitrary units) 5002 and virtual source size (in arbitrary units) 5003 plotted against the source power (in arbitrary units) 5001 for the ICP ion source 100 of FIG. 1. As in FIG. 5, a typical milling mode 5020 corresponds to a source power range from approximately 4.9 to approximately 6.0 in arbitrary units, while a typical imaging mode 5021 corresponds to a source power range from approximately 2.0 to approximately 2.5 in arbitrary units. Curve 5012 is identical to curve 4012 in FIG. 5. Curve 5013 shows an approximately linear increase in the virtual source size with increasing power to the ICP source 100.

Figure 7:
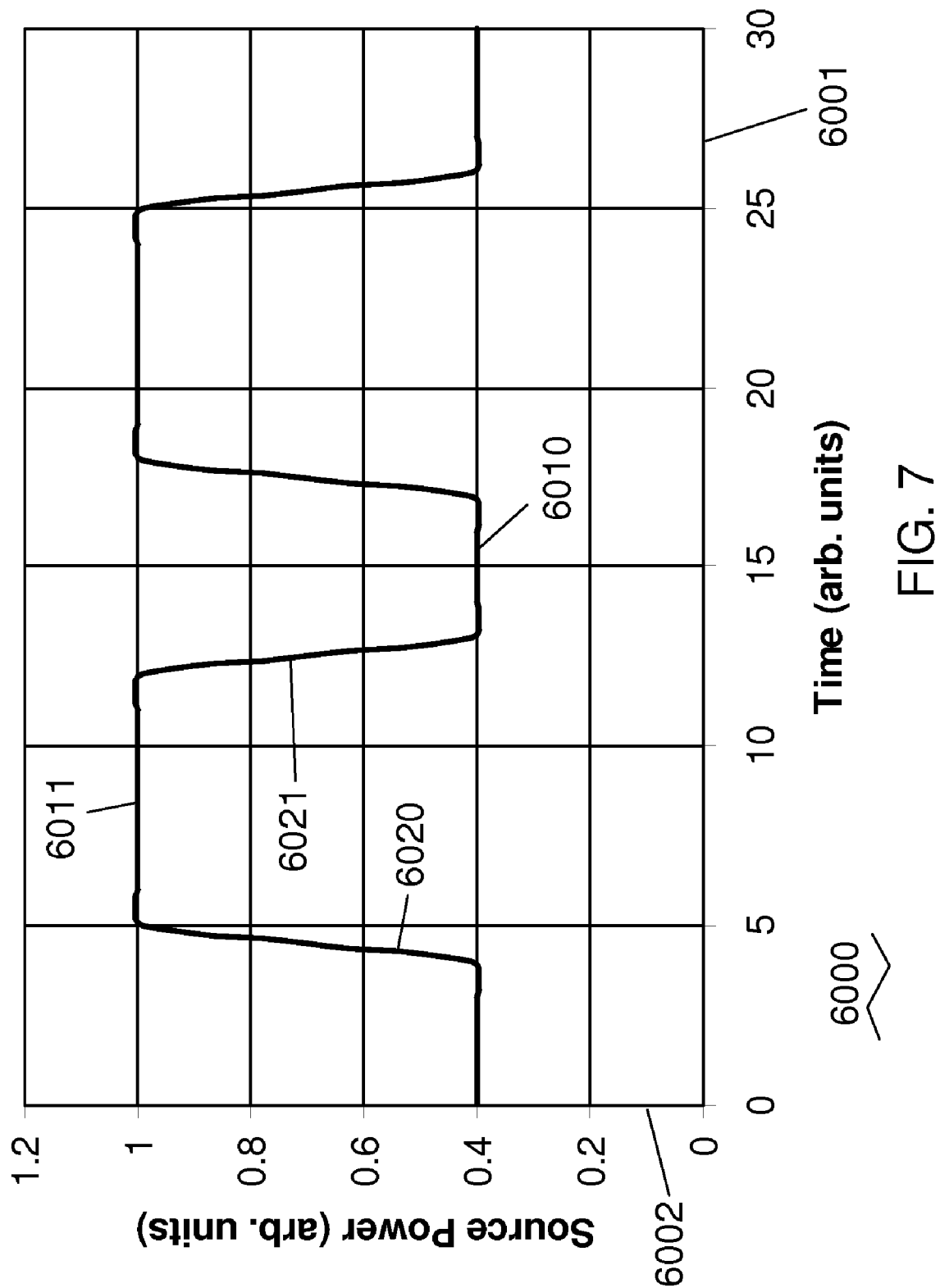
FIG. 7 shows a graph of the source power against time for the ion beam system of FIG. 1 alternating between imaging and milling modes.

FIG. 7 shows a graph 6000 of the source power 6002 (in arbitrary units) against time 6001 (in arbitrary units) for the FIB system of FIG. 1 alternating between imaging 6010 and milling 6011 modes. A transition 6020 from imaging 6010 to milling 6011 may occur typically over time scales of 1.0 in arbitrary units, allowing full stabilization of the ICP source 100 operation before beginning milling 6011. The limit on the stabilization time is the requirement for the system operating parameters to reach the required values. In embodiments where the gas pressure in the source enclosure 102 is not varied between the milling and imaging modes, a faster transition may be possible. A transition 6021 from milling 6011 to imaging 6010 must also be sufficiently long to enable the system operating parameters to stabilize before initiating imaging 6010.

FIGS. 8 through 10 discuss three alternative embodiments for aperturing the beam current in charged particle columns of the present invention.

FIG. 8A shows a schematic diagram of a focused charged particle beam column 7000 employing a moving beam defining aperture assembly 7010 operating in a bulk milling mode. Charged particles appear to diverge from a virtual source 7002, usually located within a source 7001, into a diverging beam 7003. The diverging beam 7003 then illuminates an acceptance aperture 7004 which reduces the angular spread of the beam and the beam current. Charged particles 7093 passing through beam acceptance aperture 7004 are focused by a first lens 7005 into a converging beam 7006 which forms a crossover 7007 in front of the beam defining aperture assembly 7010. Below the crossover 7007, the beam 7008 diverges towards aperture 7011. Because aperture 7011 is larger than aperture 7012, the beam current in diverging beam 7013 passing through aperture 7011 is large, corresponding to the current requirements for high rate, bulk material removal. In FIG. 8A, the beam defining aperture assembly 7010 has been positioned at a leftmost location, thereby centering aperture 7011 on the optical axis of the column 7000. A second lens 7014 focuses a beam 7015 onto a substrate 7017 at a location 7016.

FIG. 8B shows a schematic diagram of a focused charged particle beam column 7000 employing a moving beam defining aperture assembly 7000 operating in a fine resolution mode. The beam above the beam defining aperture assembly 7010 is the same as in FIG. 8A. In FIG. 8B, the beam defining aperture assembly 7010 has been positioned at a rightmost location, thereby centering aperture 7012 on the optical axis of the column 7000. Because aperture 7012 is smaller than aperture 7011, the beam current in diverging beam 7033 passing through aperture 7012 is lower, corresponding to the current requirements for imaging, polishing, or fine milling. The second lens 7014 focuses a beam 7035 onto the substrate 7017 at a location 7036. Note that the beam diameter entering lens 7014 is smaller in FIG. 8B than in FIG. 8A, thereby reducing all optical aberrations except diffraction. Since the aberrations are reduced, a smaller diameter beam may be produced in FIG. 8B than in FIG. 8A.

Advantages of the aperture selection method illustrated in FIGS. 8A and 8B include an ability to select the beam current and beam diameter by mechanical selection of the beam defining aperture. The multiple apertures (such as apertures 7011 and 712 in this example) may have different diameters as shown here to enable different operating modes. The multiple apertures may also have the same diameters to enable redundancy within the system—this can be useful in applications requiring heavy ion species which may induce aperture damage and thus reduced times between required aperture replacement.

Figure 9B:
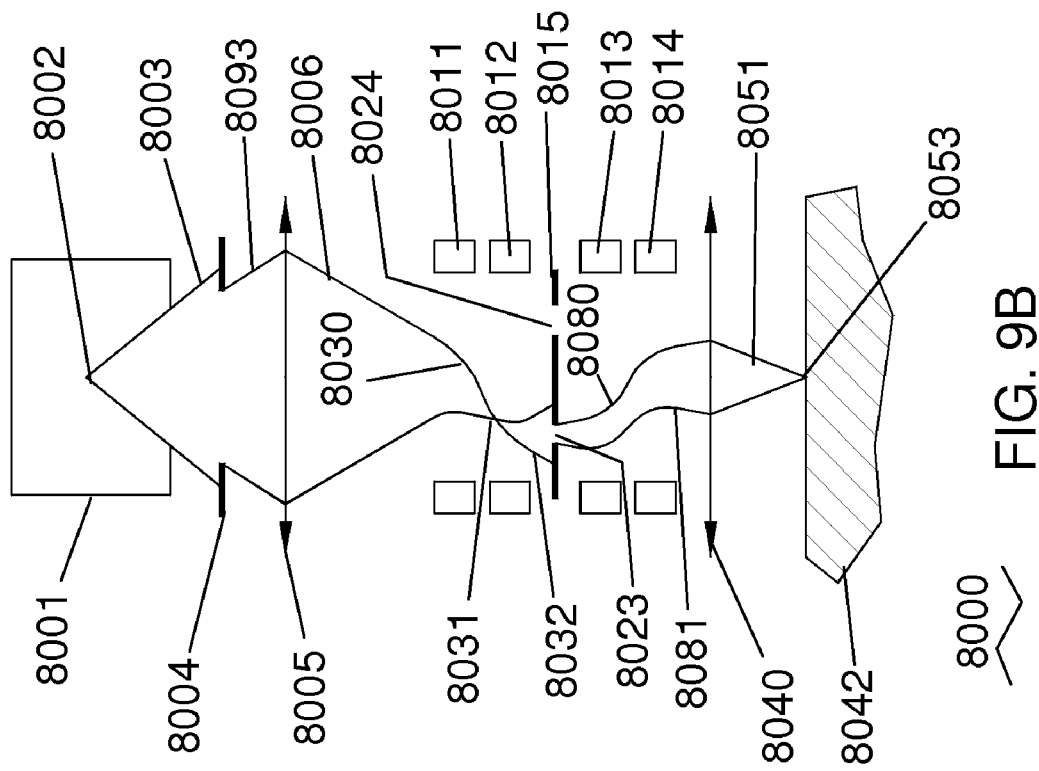
FIG. 9B shows a schematic diagram of a focused charged particle beam column employing a double deflection aperture selector operating in a fine resolution milling mode.
Figure 9A:
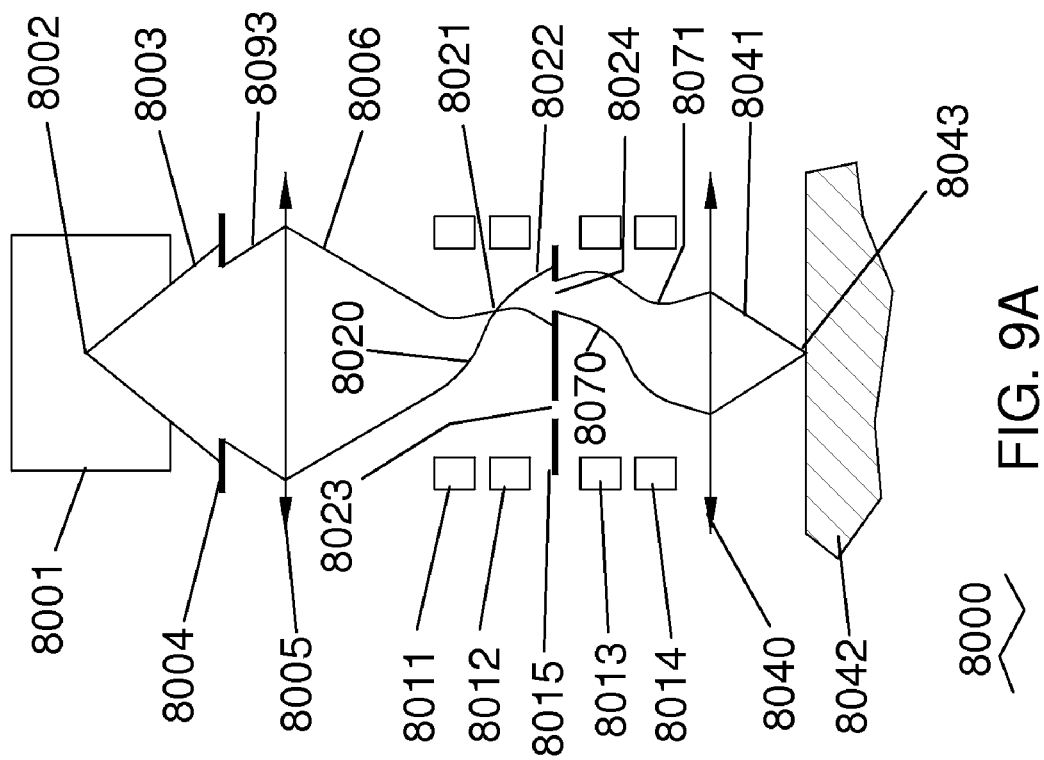
FIG. 9A shows a schematic diagram of a focused charged particle beam column employing a double deflection aperture selector operating in a bulk milling mode.

FIG. 9A shows a schematic diagram of a focused charged particle beam column 8000 employing a double deflection aperture selector operating in a bulk milling mode. Charged particles appear to diverge from a virtual source 8002, usually located within a source 8001, into a diverging beam 8003. The diverging beam 8003 then illuminates an acceptance aperture 8004 which reduces the angular spread of the beam and the beam current. Charged particles 8093 passing through beam acceptance aperture 8004 are focused by a first lens 8005 into a converging beam 8006 which enters the double deflection aperture selector comprising deflectors 8011-8014. Deflector 8011 bends beam 8020 to the right as shown. Deflector 8012 then bends beam 8022 back to the left by approximately the same amount, leaving the beam illuminating the beam defining aperture 8024 roughly parallel to the optical axis of column 8000. Lens 8005 forms a crossover 8021 above aperture 8024. Because aperture 8024 is larger than aperture 8023, the beam current in diverging beam 8070 passing through aperture 8024 is large, corresponding to the current requirements for high rate, bulk material removal—compare this with FIG. 8A. Beam 8070 passing through aperture 8024 is bent to the left by deflector 8013. Deflector 8014 then bends the beam 8071 back to the right by approximately the same amount, leaving the beam on the optical axis of column 8000. A second lens 8040 focuses a beam 8041 onto a substrate 8042 at a location 8043.

FIG. 9B shows a schematic diagram of a focused charged particle beam column 8000 employing a double deflection aperture selector operating in a fine resolution milling mode. The beam down to the entrance of deflector 8011 is the same as in FIG. 9A. Deflector 8011 bends beam 8030 to the left as shown. Deflector 8012 then bends beam 8032 back to the right by approximately the same amount, leaving the beam illuminating the beam defining aperture 8023 roughly parallel to the optical axis of column 8000. Lens 8005 forms a crossover 8321 above aperture 8023. Because aperture 8023 is smaller than aperture 8024, the beam current in diverging beam 8080 passing through aperture 8023 is smaller, corresponding to the current requirements for imaging, polishing, or fine milling—compare this with FIG. 8B. Beam 8080 passing through aperture 8024 is bent to the right by deflector 8013. Deflector 8014 then bends the beam 8071 back to the left by approximately the same amount, leaving the beam on the optical axis of column 8000. A second lens 8040 focuses a beam 8051 onto a substrate 8042 at a location 8053. Note that the beam diameter entering lens 8014 is smaller in FIG. 9B than in FIG. 9A, thereby reducing all optical aberrations except diffraction. Since the aberrations are reduced, a smaller diameter beam may be produced in FIG. 9B than in FIG. 9A. The deflectors 8011-8014 may be either electrostatic deflectors, magnetic deflectors, or combined electrostatic/magnetic deflectors as is familiar to those skilled in the art.

Advantages of the embodiment in FIGS. 9A and 9B include the ability to select the beam size and current at the substrate 8042 relatively quickly, since no mechanical aperture motions are required, only changes to voltages and/or currents in the deflectors 8011-8014. Another advantage is that the deflectors 8011-8014 may also be used for beam blanking. Beam blanking would then consist of the application of voltages an/or currents to deflectors 8011-8014 causing the beam to be moved away from both apertures 8023 or 8024, thus cutting off beam transmission past beam defining aperture assembly 8015. Disadvantages of the embodiment in FIGS. 9A and 9B include the need for additional deflector elements and their associated control electronics, thereby increasing system complexity and cost.

FIG. 10A shows a schematic diagram of a focused charged particle beam column 9000 employing an electronically variable aperture operating in a bulk milling mode. Charged particles appear to diverge from a virtual source 9002, usually located within a source 9001, into a diverging beam 9003. The diverging beam 9003 then illuminates an acceptance aperture 9004 which reduces the angular spread of the beam and the beam current. Charged particles 9093 passing through beam acceptance aperture 9004 are focused by a first lens 9005 into a converging beam 9006 which forms a crossover 9007 in front of the beam defining aperture assembly 9010. Below the crossover 9007, the beam 9008 diverges towards aperture 9011. For the embodiment illustrated in FIGS. 10A and 10B, the strength of the first lens 9005 is used to move the position of the crossover 9007 relative to aperture 9011, thereby adjusting the beam angles which pass through aperture 9011 and also the current in the beam reaching a substrate 9017. In FIG. 10A, crossover 9007 is relatively close to aperture 9011, thus a relatively large portion of beam 9008 will pass through aperture 9011. In FIG. 10B, crossover 9027 is higher than crossover 9007 in FIG. 10A, thus a relatively small portion of beam 9028 will pass through aperture 9011. A second lens 9014 focuses a beam 9015 onto the substrate 7017 in both FIGS. 9A and 9B. As was the case in FIGS. 8 and 9, the smaller beam angles passing into lens 9014 in FIG. 10B will result in reduced aberrations (except diffraction), giving potentially a smaller beam on the substrate 9017 at location 9036, compared with the size of the beam in FIG. 10A at location 9016.

Advantages of the embodiment shown in FIGS. 10A and 10B include the ability to control the beam current and size at the substrate without the need for either a mechanically moving beam defining aperture assembly as in FIG. 8, or a system of beam deflectors as in FIG. 9. Another advantage is that the higher crossover 9027 in FIG. 10B, compared with the position of crossover 9007 in FIG. 10A, will provide a higher demagnification of the virtual source. Thus in FIG. 10B, where a fine resolution beam is desired, the effects of the virtual source size will be reduced, thereby potentially enabling the formation of smaller beams 9036 at the substrate 9017.

In all three embodiments shown in FIGS. 8-10, an image of the virtual source is formed at or near the surface of a substrate by two lenses in a charged particle optical column. However, for full flexibility in controlling both the beam size/current at the same time as controlling the overall demagnification from the virtual source to the substrate, it would be necessary to implement the columns in FIGS. 8-10 with at least one additional lens. Design of charged particle columns is familiar to those skilled in the art.

Embodiments of the present invention can provide multiple modes of operating. Besides an imaging mode described above, embodiments could provide, for example, multiple milling modes—a high current, coarse milling mode for rapid material removal, an intermediate current mode for normal milling accuracy, and a lower current mode for precision milling. For example, a high current mode will typically have a beam current of greater than 1 nA, more preferably greater than 20 nA, and even more preferably greater than 100 nA. A precision milling mode will typically have a spot size of less than 500 nm, more preferably less than 200 nm and most preferably less than 100 nm. The beam current for the precision milling mode is preferably between 5 pA and 20 nA. The intermediate current mode would have a current less than that of the coarse milling mode and a spot size greater than that of the precision milling mode. While various modes are described to provide examples, the operating parameters of the various modes can overlap, and an operator can vary the operating parameters from the preset operating parameters defined for predefined modes.

A number of imaging modes are also possible within the scope of the present invention, wherein the imaging signal could be generated by collection of secondary electrons, secondary ions, and/or by secondary ion mass spectrometry (SIMS). In the SIMS mode, a detector optics assembly could be integrated with the focusing charged particle column that would be generating an ion beam focused at or near the substrate surface. The imaging signal for this mode could comprise signals derived from one or more secondary ion species collected from the substrate surface. For example, if a Xenon ion beam were used to sputter a semiconductor device down to a buried layer implanted with boron, a signal derived from collected boron secondary ions would provide a high signal-to-noise endpoint detection capability for the milling process. An example of such a secondary ion collection assembly is provided in U.S. Pat. No. 4,556,794, issued Dec. 3, 1985, "Secondary Ion Collection and Transport System for Ion Microprobe".

Still another aspect of the present invention is the control of the ion species extracted from the inductively coupled plasma ion source to select particular charge states and/or to select between atomic and molecular ion species. For example, with an oxygen feed gas, it should be possible to extract both $O^+$ or $O_2^+$ ions, with a ratio dependent on the plasma ion source operating parameters. It should also be possible to extract $O^-$ ions as well. For secondary ion mass spectrometry, it is well known that the levels of negative and positive secondary ion generation are highly dependent on the impinging primary ion species. One advantage of the inductively-coupled plasma ion source may be the capability for multiple mode operation, including milling, secondary electron imaging, secondary ion imaging, and both positive and negative secondary ion mass spectrometric imaging. For each of these modes, in general, the optimum source and column optics operating parameters could differ from those of the other modes. As described above, secondary ion mass spectrometric endpoint verification offers the potential of high signal-to-noise, since interference from both primary ions and bulk material ions is eliminated by the mass selectivity of the SIMS detector optics.

Yet another aspect of the present invention is the potential for the use of the charged particle system with multiple modes in which one or more processing modes comprise the use of either deposition precursor gases or etchant precursor gases. For this embodiment, the primary ion or electron beam would interact on or near the surface of the substrate with the gas to produce deposition or enhanced etching. As was the case for the pure beam-induced processes (i.e., processes not employing precursor gases), the optimum system parameters would generally differ between the processing step (deposition or etching) and the imaging step. Deposition and etch precursor gases are typically provided by a gas injection system, and precursor gases for etching various surfaces and depositing various materials are known. An charged particle beam operating mode used to induce a chemical reaction preferably provides a beam having a low current density at the work piece, to avoid exhausting the precursor molecules adsorbed onto the work piece surface at the beam impact point. Electrons and ions are useful for beam-induced processing.

Although the present invention and its advantages have been described in detail, it should be understood that various changes, substitutions and alterations can be made to the embodiments described herein without departing from the spirit and scope of the invention as defined by the appended claims. For example, other types of ion sources such as liquid metal sources, dc plasma sources, capacitively coupled RF plasma ion sources, or gaseous field ionization sources, may be substituted for the inductively-coupled plasma (ICP) source shown in FIG. 1, with corresponding changes to the set of potential operating parameters for the FIB system.

Various ion column configurations with a single lens, or with more than two lenses may be substituted for the two lens ion column configuration shown in FIG. 1. Magnetic lenses may be substituted for the round electrostatic lenses illustrated in FIG. 1.

Quadrupole doublet, triplet, or multiplets may be substituted for the electrostatic round lenses shown in FIG. 1, where the quadrupoles may be electrostatic, magnetic, or combined magnetic and electrostatic. In particular, combined magnetic and electrostatic quadrupoles may be employed for applications in which correction of the chromatic aberrations of the ion column lenses is desired in order to obtain improved resolution (reduced beam sizes) at the substrate surface, in particular for imaging modes.

In another embodiment of the present invention, a gas feed system may be implemented in the processing chamber containing the substrate. An etchant precursor gas would be directed towards the substrate near the location at which the charged particle beam impinges on the surface of the substrate. Interaction of the charged particle beam with adsorbed or gas phase etchant precursor gas molecules may then be used to enhance the material removal rate or other aspects of the material removal process, including surface roughness, material selectivity, etc, as is familiar to those skilled in the art. In this embodiment, the parameters used in controlling the gas feed system, such as the gas species, gas flow rate, and gas pressure in the processing chamber, would be comprised in the overall system control parameters to be selected for each of the two or more operating modes of the present invention. Alternatively, the gas feed system may be used to supply a deposition precursor gas, for a beam induced chemical deposition process, as is familiar to those skilled in the art. Aspects of the control of the gas feed system would be the similar to those described above for a beam induced chemical etch process. In another embodiment, electrons are extracted from the plasma source and focused into an electron beam for imaging or for electron beam induced etching or deposition.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A charged particle beam system, comprising:
   a plasma chamber for containing a plasma gas at a plasma chamber gas pressure;
   an extraction electrode to which a voltage can be applied for extracting ions or electrons from the plasma chamber;
   a power supply for supplying power to the plasma chamber to maintain a plasma in the plasma chamber;
   a gas supply for supplying the plasma gas to the plasma chamber;
   a focusing column comprising a plurality of lenses for focusing ions or electrons extracted from the plasma chamber; and
   a computer readable memory storing a set of operating parameters for each of multiple operating modes, the operating parameters including one or more of:
   the plasma chamber gas pressure;
   the plasma gas species;
   the power supplied to the plasma;
   the voltage supplied to the extraction electrode,
   a controller programmed to selectively switching the charged particle beam system between operating modes, the controller causing at least one of the operating parameters of the charged particle beam system to be set in accordance with the stored operating parameters for the selected mode; and
   one or more beam-limiting apertures and an aperture positioning actuator, the controller programmed to selectively position a beam-limiting aperture corresponding to the selected operating mode in the path of the charged particle beam depending on the beam current required for the selected operating mode.

2. The charged particle beam system of claim 1 in which the controller is programmed to selectively switch the charged particle beam system between a high resolution imaging mode and a lower resolution milling mode.

3. The charged particle beam system of claim 1 in which the controller is programmed to selectively switch the charged particle beam system between a high current milling mode having a beam current of at least 200 pA and a lower current imaging mode.

4. The charged particle beam system of claim 1 in which the controller is programmed to selectively switch between operating modes by changing the plasma chamber gas pressure and the power supplied to the plasma.

5. The charged particle beam system of claim 1 in which the controller is programmed to selectively switch between operating modes by changing the plasma gas between a first gas specie in a first operating mode and a second gas specie in a second operating mode.

6. The charged particle beam system of claim 1 in which the controller is programmed to deflect the beam to pass through an aperture corresponding to the selected operating mode.

7. The charged particle beam system of claim 1 in which the controller is programmed to selectively adjust the strengths of the lenses in the column to control, depending on the selected operating mode, the size of the charged particle beam at the one or more beam limiting apertures.

8. The charged particle beam system of claim 1 further comprising a vacuum pump for removing gas from the plasma chamber in response to a command from the controller when switching between operating modes.

9. The charged particle beam system of claim 1 in which the power supply supplies power at a radio frequency and further comprising a conductive coil wrapped at least one time around the plasma chamber.

10. The charged particle beam system of claim 1 in which the focusing column focuses an image of a virtual source formed in the plasma chamber at or near the surface of a substrate.

11. The charged particle beam system of claim 10 in which the controller is programmed to selectively switch the charged particle beam system between a high resolution imaging mode and a low resolution mode and in which the image of the virtual source formed at or near the surface of the substrate in imaging mode has a diameter of less than 500 nm.

12. The charged particle beam system of claim 1 in which the controller is programmed to selectively switch between one operating mode that extracts electrons from the plasma source and a second operating mode that extracts ions from the plasma source.

13. A charged particle beam system, comprising:
a plasma chamber for containing a plasma gas at a plasma chamber gas pressure;
an extraction electrode to which a voltage can be applied for extracting ions or electrons from the plasma chamber;
a power supply for supplying power to the plasma chamber to maintain a plasma in the plasma chamber;
a gas supply for supplying the plasma gas to the plasma chamber;
a focusing column comprising a plurality of lenses for focusing ions or electrons extracted from the plasma chamber; and a computer readable memory storing a set of operating parameters for each of multiple operating modes, the operating parameters including one or more of:
the plasma chamber gas pressure;
the plasma gas species;
the power supplied to the plasma;
the voltage supplied to the extraction electrode,
a controller programmed to selectively switching the charged particle beam system between operating modes, the controller causing at least one of the operating parameters of the charged particle beam system to be set in accordance with the stored operating parameters for the selected mode; and
a sensor for detecting light from the plasma chamber and providing input to the controller, the controller programmed to determine whether a plasma exists in the plasma chamber.

14. The charged particle beam system of claim 13 in which the controller is programmed to notify an operator or to ignite the plasma if an operational mode is selected and no plasma exists in the plasma chamber.

15. A method of operating a charged particle beam system in multiple modes, the charged particle beam system including a plasma source and a charged particle focusing column, wherein a first operating mode provides a first beam current at a work piece surface and a second operating mode provides a second beam current at the work piece surface, the second current being equal to or smaller than the first current, comprising:
automatically, in response to selecting operation in the first mode, configuring the focused charged particle beam system to operate in the first mode by setting at least one plasma source operating parameter to a predetermined value for the first mode;
directing the charged particle beam generated by charged particle beam system operating in the first mode toward the work piece surface;
automatically in response to selecting operation in the second mode, configuring the focused charged particle beam system to operate in the second mode by changing at least one of the plasma source operating parameters to a predetermined value for the second mode;
directing the charged particle beam generated by charged particle beam system operating in the second mode toward the work piece surface; and
focusing an image of a virtual source formed by the plasma source at or near the surface of the work piece.

16. The method of claim 15, in which the plasma source includes an extractor electrode and a plasma chamber contains a gas and wherein:
setting at least one plasma source operating parameters to a predetermined value for the first mode includes setting at least one of the following plasma source operating parameters:
(a) the gas pressure in the plasma chamber;
(b) the power supplied to the plasma source; and
(c) the voltage supplied to the extraction electrode; and
changing at least one operating parameters for the plasma source to a predetermined value for the second mode includes changing at least one of the plasma source operating parameters (a), (b) or (c).

17. The method of claim 15, wherein the focused charged particle beam system operates in the first mode to alter the work piece surface, and wherein an image acquired while operating the focused charged particle beam system in the second mode provides endpoint verification for the alteration.

18. The method of claim 15, wherein:
the charged particle beam focusing column includes multiple electrostatic lenses; and
first mode operating parameters include first values of voltages to be applied to each of the multiple electrostatic lenses; and
the second mode operating parameters include second values of voltages to be applied to each of the multiple electrostatic lenses.

19. The method of claim 15, wherein the charged particle focusing column comprises multiple beam defining apertures and wherein the aperture through which the charged particle beam passes is selected in accordance with the operating mode.

20. The method of claim 15, wherein the charged particle focusing column comprises a multiplicity of lenses and a beam defining aperture, wherein the first mode operating parameters comprise a first selection of excitations to each of the multiplicity of lenses in the charged particle focusing column, and wherein the second mode operating parameters comprise a second selection of excitations to each of the multiplicity of lenses in the charged particle focusing column.

21. The method of claim 15, in which directing the charged particle beam generated by charged particle beam system operating in the first mode or the second mode includes providing a precursor gas at the work piece surface for interacting with the charged particle beam to deposit a material onto the surface or to etch a material from the surface.

22. A method of operating a charged particle beam system in multiple modes, the charged particle beam system including a plasma source and a charged particle focusing column, wherein a first operating mode provides a first beam current at a work piece surface and a second operating mode provides a second beam current at the work piece surface, the second current being equal to or smaller than the first current, comprising:
automatically, in response to selecting operation in the first mode, configuring the focused charged particle beam system to operate in the first mode by setting at least one plasma source operating parameter to a predetermined value for the first mode;
directing the charged particle beam generated by charged particle beam system operating in the first mode toward the work piece surface;
automatically in response to selecting operation in the second mode, configuring the focused charged particle beam system to operate in the second mode by changing at least one of the plasma source operating parameters to a predetermined value for the second mode;
directing the charged particle beam generated by charged particle beam system operating in the second mode toward the work piece surface; and
automatically in response to a user selecting operation in a third mode, configuring the focused charged particle beam system to operate in the third mode by changing at least one of the plasma source operating parameters in accordance with predetermined values for the third mode, and directing the charged particle beam generated by charged particle beam system operating in the third mode toward the work piece surface.

* * * * *